United States Patent
Shaw et al.

[11] Patent Number: 6,051,866
[45] Date of Patent: *Apr. 18, 2000

[54] MICROSTRUCTURES AND SINGLE MASK, SINGLE-CRYSTAL PROCESS FOR FABRICATION THEREOF

[75] Inventors: Kevin A. Shaw; Z. Lisa Zhang; Noel C. MacDonald, all of Ithaca, N.Y.

[73] Assignee: Cornell Research Foundation, Inc., Ithaca, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 09/132,254

[22] Filed: Aug. 11, 1998

Related U.S. Application Data

[63] Continuation of application No. 08/804,826, Feb. 24, 1997, Pat. No. 5,846,849, which is a continuation of application No. 08/312,797, Sep. 27, 1994, Pat. No. 5,719,073, which is a continuation of application No. 08/013,319, Feb. 4, 1993, abandoned.

[51] Int. Cl.$^7$ .................................................. H01L 29/82
[52] U.S. Cl. .......................... 257/417; 257/418; 257/420; 257/622; 73/514.21; 73/514.23; 73/514.36; 73/514.37; 73/DIG. 1; 438/52
[58] Field of Search ................................ 438/52; 257/622; 257/417, 418, 420; 73/514.36, 514.37, 514.21, 514.22, DIG. 1

[56] References Cited

U.S. PATENT DOCUMENTS

| | | | |
|---|---|---|---|
| 3,672,985 | 6/1972 | Nathanson et al. | 117/212 |
| 4,437,226 | 3/1984 | Soclof | 29/577 R |
| 4,472,239 | 9/1984 | Johnson et al. | 156/647 |

(List continued on next page.)

FOREIGN PATENT DOCUMENTS

| | | |
|---|---|---|
| 4000496 | 1/1991 | Germany . |
| 4000496 | 2/1991 | Germany . |
| 5-343679 | 12/1993 | Japan ............................ H01L 29/784 |
| 58-89859 | 2/1994 | Japan . |

OTHER PUBLICATIONS

"An RIE Process for Submicron, Silicon Electromechanical Structures"; Zhang and MacDonald; May 1991; pp. 520–523.

"Anisotropic Reactive Ion Etching of Aluminum Using $Cl_2$, $BC_3$, and $CH_4$ Gases"; Lutze, Perera & Krusius; Jan. 1990; J. Electrochem. Soc.; vo. 137; No. 1.

"Formation of Submicron Silicon–on–Insulator Structures by Lateral Oxidation of Substrate–Silicon Islands"; Arney and MacDonald; Dec. 1987; pp. 341–345.

IBM Technical Disclosure Bulletin, vol. 32, No. 9A, Feb. 1990, High Density Dram Cell (Q–Elope Cell), pp. 478–482.

T. Ozaki, et al., "0.228m2 Trenc Cell Technologies with Bottle–Shaped Capacitor for 1Gbit DRAMS", 1995, IEEE, pp. 27.3.1–27.3.4.

D. Hisamoto, et al., "A Fully Depleted Lean–channel Transistor (DELTA) . . . ", IEEE, 1989, pp. 34.5.1–34.5.4.

"Fabrication of High Frequency Two–Dimensional Nano-actuators for Scanned Probe Devices"; Yao et al; Journal of Microelectromechanical Systems; vol. 1; No. 1; Mar. 1992; pp. 14–22.

"New SOI CMOS Process with Selective Oxidation"; Kubota et al; IDEM 86; pp. 814–816.

"Nanostructures in Motion"; Yao et al; Nanostructures and Mesoscopic Systems; Wiley P. Kirk and Mark Reed; Eds. Academic Press; Dec. 1991; pp. 1–9.

Anisotropic Reactive Ion Etching of $MoSi_2$ and In Situ Doped n+ and p+ Polysilicon Using $Cl_2$ and $BCl_3$; Mele, Arney, Krusius, and MacDonald; J. Electrochem. Soc.; vol. 135; No. 9; Sep. 1988; pp. 2373–2378.

*Primary Examiner*—William Mintel
*Attorney, Agent, or Firm*—Jones, Tullar & Cooper, PC

[57] ABSTRACT

A single mask, low temperature reactive ion etching process for fabricating high aspect ratio, released single crystal microelectromechanical structures independently of crystal orientation.

23 Claims, 12 Drawing Sheets

U.S. PATENT DOCUMENTS

| | | | |
|---|---|---|---|
| 4,522,682 | 6/1985 | Soclof | 156/647 |
| 4,648,173 | 3/1987 | Malaviya | 29/576 W |
| 4,649,625 | 3/1987 | Lu | 29/571 |
| 4,653,326 | 3/1987 | Danel et al. | 73/517 R |
| 4,670,092 | 6/1987 | Motamedi | 156/643 |
| 4,682,503 | 7/1987 | Higashi et al. | 73/755 |
| 4,685,198 | 8/1987 | Kawakita et al. | 437/73 |
| 4,740,410 | 4/1988 | Muller et al. | 381/173 |
| 4,776,924 | 10/1988 | Delapierre | 156/647 |
| 4,783,237 | 11/1988 | Aine et al. | 437/15 |
| 4,783,821 | 11/1988 | Muller et al. | 381/173 |
| 4,816,884 | 3/1989 | Hwang et al. | 357/23.6 |
| 4,833,516 | 5/1989 | Hwang et al. | 357/23.6 |
| 4,845,048 | 7/1989 | Tamaki et al. | 437/62 |
| 4,853,348 | 8/1989 | Tsubouchi et al. | 437/203 |
| 4,914,628 | 4/1990 | Nishimura | 365/149 |
| 4,980,317 | 12/1990 | Koblinger et al. | 437/228 |
| 4,988,637 | 1/1991 | Dhong et al. | 437/52 |
| 5,008,214 | 4/1991 | Redwine | 437/52 |
| 5,068,203 | 11/1991 | Logsdon et al. | 437/89 |
| 5,072,288 | 12/1991 | MacDonald et al. | 357/68 |
| 5,106,775 | 4/1992 | Kaga et al. | 437/52 |
| 5,198,390 | 3/1993 | MacDonald et al. | 437/203 |
| 5,235,187 | 8/1993 | Arney et al. | 250/306 |
| 5,264,716 | 11/1993 | Kenney | 257/301 |
| 5,346,834 | 9/1994 | Hisamoto et al. | 437/41 |
| 5,360,758 | 11/1994 | Bronner et al. | 437/52 |
| 5,393,375 | 2/1995 | MacDonald et al. | 156/643 |
| 5,426,070 | 6/1995 | Shaw et al. | 437/203 |
| 5,443,992 | 8/1995 | Risch et al. | 437/29 |
| 5,466,625 | 11/1995 | Hsieh et al. | 437/52 |
| 5,466,636 | 11/1995 | Cronin et al. | 437/187 |
| 5,508,219 | 4/1996 | Bronner et al. | 437/52 |
| 5,528,062 | 6/1996 | Hsieh et al. | 257/298 |
| 5,547,903 | 8/1996 | Hsu | 437/203 |
| 5,581,101 | 12/1996 | Ning et al. | 257/347 |
| 5,614,431 | 3/1997 | Debrosse | 437/52 |
| 5,643,815 | 7/1997 | Vu et al. | 437/44 |
| 5,719,073 | 2/1998 | Shaw et al. | 437/228 |
| 5,846,849 | 12/1998 | Shaw et al. | 438/52 |

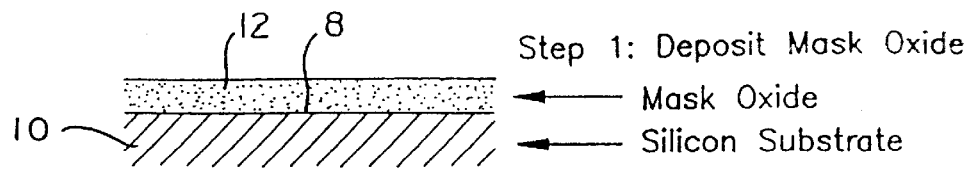

Step 1: Deposit Mask Oxide
— Mask Oxide
— Silicon Substrate

FIG. 1A

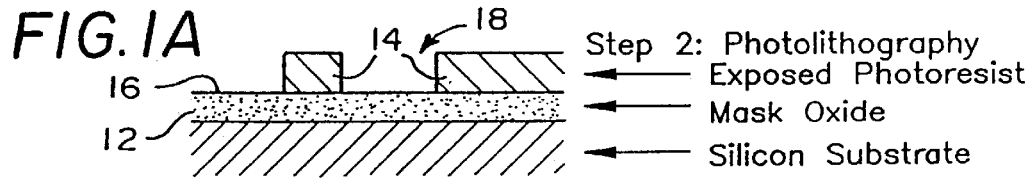

Step 2: Photolithography
— Exposed Photoresist
— Mask Oxide
— Silicon Substrate

FIG. 1B

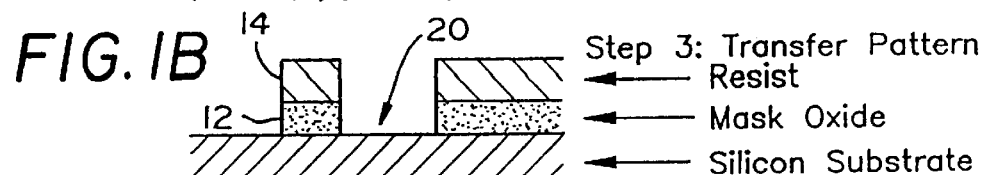

Step 3: Transfer Pattern
— Resist
— Mask Oxide
— Silicon Substrate

FIG. 1C

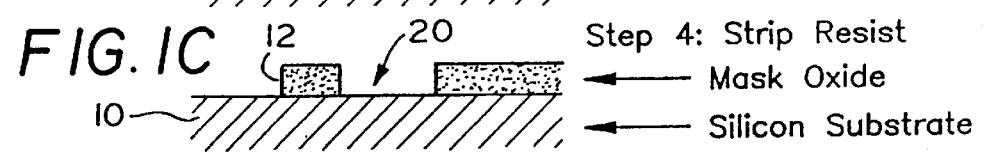

Step 4: Strip Resist
— Mask Oxide
— Silicon Substrate

FIG. 1D

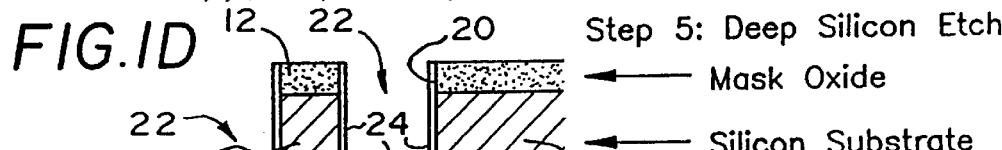

Step 5: Deep Silicon Etch
— Mask Oxide
— Silicon Substrate

FIG. 1E

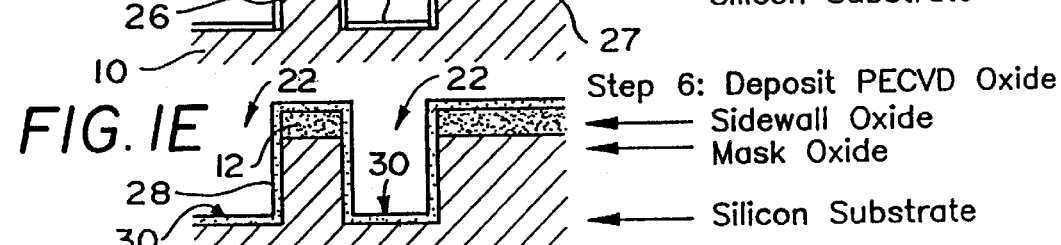

Step 6: Deposit PECVD Oxide
— Sidewall Oxide
— Mask Oxide
— Silicon Substrate

FIG. 1F

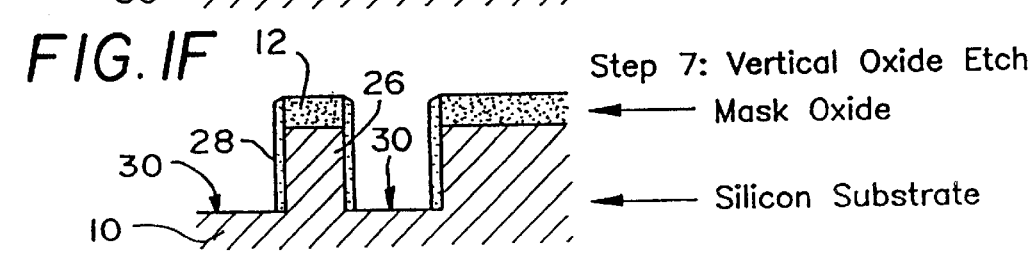

Step 7: Vertical Oxide Etch
— Mask Oxide
— Silicon Substrate

FIG. 1G

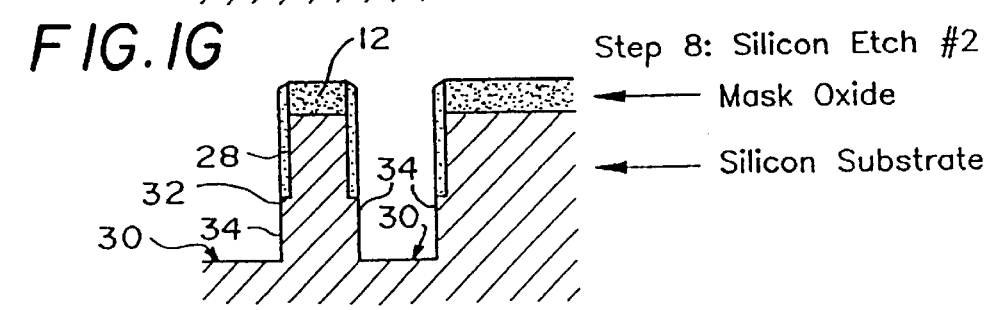

Step 8: Silicon Etch #2
— Mask Oxide
— Silicon Substrate

FIG. 1H (optional)

(optional)

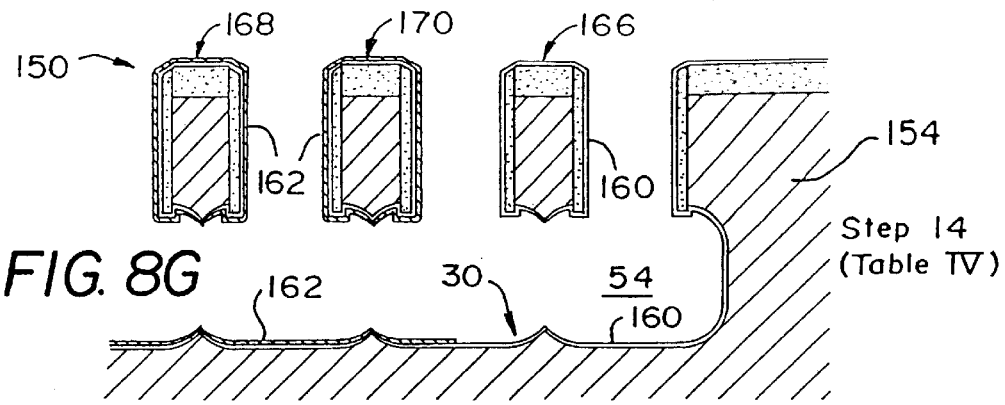
FIG. 8G — Step 14 (Table IV)
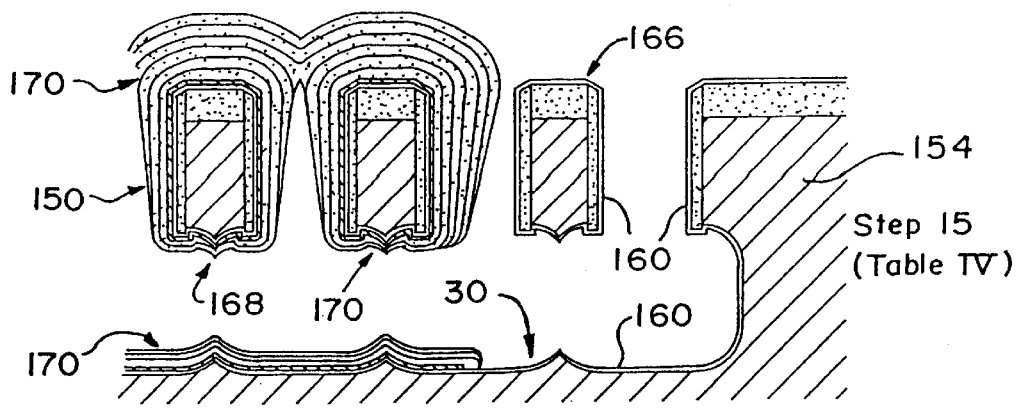
FIG. 8H — Step 15 (Table IV)
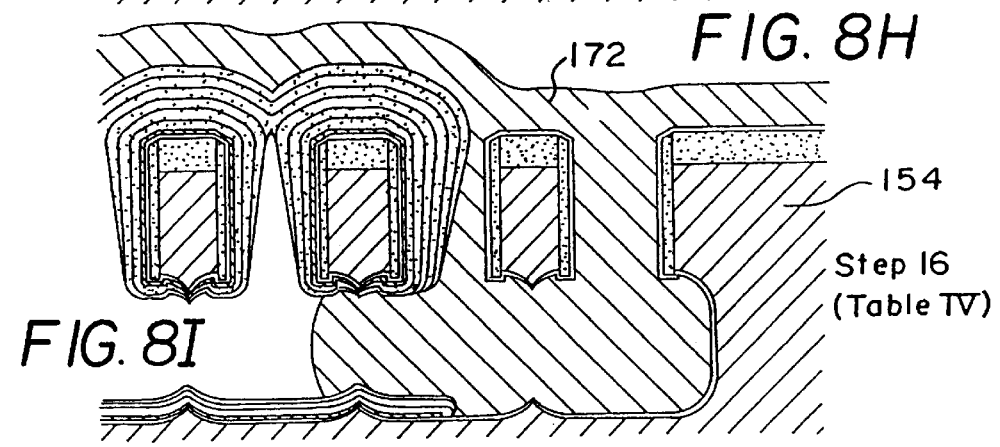
FIG. 8I — Step 16 (Table IV)
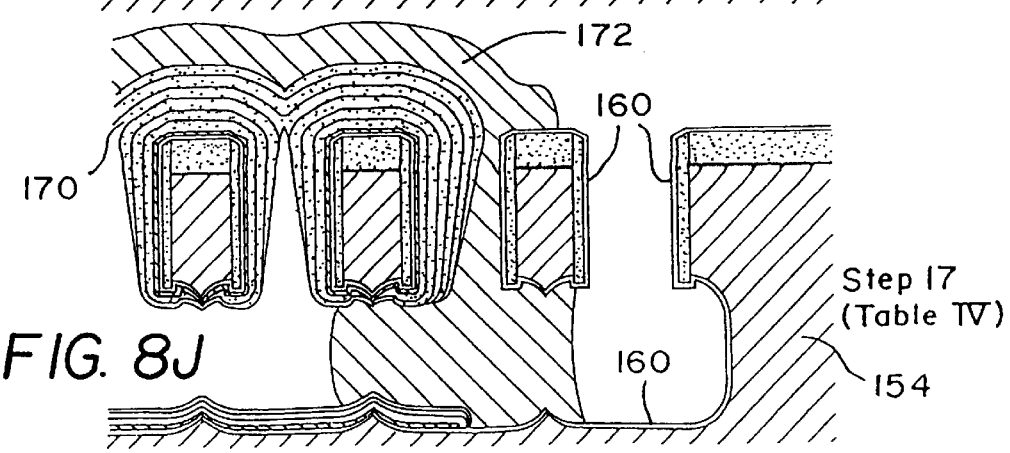
FIG. 8J — Step 17 (Table IV)

MICROSTRUCTURES AND SINGLE MASK, SINGLE-CRYSTAL PROCESS FOR FABRICATION THEREOF

This application is a continuation of copending application Ser. No. 08/804,826, filed on Feb. 24, 1997, now U.S. Pat. No. 5,846,849 which is a continuation of application Ser. No. 08/312,797, filed on Sep. 27, 1994, now U.S. Pat. No. 5,719,073, which is a continuation of application Ser. No. 08/013,319 filed on Feb. 4, 1993, now abandoned, the disclosures of which are hereby incorporated herein by reference.

This invention was made with Government support under Grant No. DABT 63-92-C-0019, awarded by DARPA and Grant Nos. ECS 8805866 and ECS 8815775 awarded by the National Science Foundation. The Government has certain rights in the invention.

BACKGROUND OF THE INVENTION

This invention relates, in general, to microstructures and to a single mask process for fabricating them and more particularly, to microelectromechanical and microoptomechanical structures-and to a single-mask process for fabricating complete structures including released, movable elements and connectors such as pads, runners, electrodes, and the like on a substrate.

Recent developments in micromechanics have successfully led to the fabrication of microactuators utilizing processes which have involved either bulk or surface micromachining. The most popular surface micromachining process has used polysilicon as the structural layer in which the mechanical structures are formed. In a typical polysilicon process, a sacrificial layer is deposited on a silicon substrate prior to the deposition of the polysilicon layer. The mechanical structures are defined in the polysilicon, and then the sacrificial layer is etched partially or completely down to the silicon substrate to free the structures.

The initial research into surface micromachining established the viability of the technology. Moving rotors, gears, accelerometers, and other structures have been fashioned through the use of such a process to permit relative motion between the structures and the substrate. This process relies on chemical vapor deposition (CVD) to form the alternating layers of oxide and polysilicon and provides significant freedom in device design; however, CVD silicon is usually limited to layers no thicker than 1–2 $\mu$m, since residual stress in thicker layers overwhelms the structure and causes curling. Thus, although a large variety of layers can be combined to form very complicated structures, each layer is limited in thickness. In addition, the wet chemistry needed to remove the interleaved oxide layers often takes tens of hours of etching to remove, and once released the structures often reattach or stick to the substrate because of static electricity, and this requires elaborate process steps to overcome. The structures made of polysilicon inherently have a crystalline structure which has low breaking strength because of grain sizes, as well as electronic properties which are inferior to single crystal silicon. Furthermore although this technology is well established, it is not easily scaled for the formation of submicron, high aspect ratio mechanical structures.

In bulk micromachining, a silicon substrate is etched and sculpted to leave a structure. This has typically been done using wet chemical etchants such as EDP, KOH, and hydrozine to undercut single crystal silicon structures from a silicon wafer. However, such processes are dependent on the crystal orientation within the silicon substrate, since the chemistry etches as much as ten times faster in some crystallographic planes of silicon than in other planes. Although the shapes can be controlled to some degree by the use of photolithography and by heavy implantation of boron, which acts as an etch stop, it is difficult to control the process and accordingly, the type, shape and size of the structures that can be fabricated with the wet chemical etch techniques are severely limited. In particular, wet etch processes are not applicable to small (micron size) structure definition, because they are not controllable on that scale.

A dry bulk micromachining process which utilizes thermolateral oxidation to completely isolate 0.5 $\mu$m wide islands of single crystal silicon is described, for example, in the article entitled "Formation of Submicron Silicon-On-Insulator Structures by Lateral Oxidation of Substrate-Silicon Islands", *Journal of Vacuum Science Technology*, B 6(1), January/February 1988, pp. 341–344, by S. C. Arney et al. This work led to the development of a reactive ion etching (RIE) process for the fabrication of submicron, single crystal silicon, movable mechanical structures wherein the oxidation-isolation step described in the Arney et al publication was replaced with an $SF_6$ isotropic release etch. This process, which allowed the release of wider structures, in the range of 1.0 $\mu$m, and deeper structures, in the range of 2–4 $\mu$m, is described in U.S. patent application Ser. No. 07/821,944, filed Jan. 16, 1992, assigned to the assignee of the present application. As there described, this dry etch process utilizes multiple masks to define structural elements and metal contacts and permitted definition of small, complex structures in single crystal silicon, and was easy to implement. However, the second lithography step was difficult to apply to deeper structures, particularly because of problems in aligning the second mask. Furthermore, that process relied upon the formation of a silicon dioxide layer on a single crystal silicon substrate, but since other materials such as GaAs or SiGe do not generate an oxide layer the way silicon does, the process could not be transferred to such other substrate materials.

In copending U.S. patent application Ser. No. 07/829,348, a process for releasing micromechanical structures in single crystal materials other than silicon is described. This process uses chemically assisted ion beam etching (CAIBE) and/or reactive ion beam etching (RIBE) to make vertical structures on a substrate, and uses reactive ion etching (RIE) to laterally undercut and release the structure. The process utilizes multiple masks, however, and thus encountered similar problems to the silicon process described above in the formation of deeper structures, and in the alignment of the second mask.

The use of single-crystal materials for mechanical structures can be beneficial, since these materials have fewer defects, no grain boundaries and therefore scale to submicron dimensions while retaining their structural and mechanical properties. In addition, the use of single-crystal materials, particularly single crystal silicon and gallium arsenide, to produce mechanical sensors and actuators can facilitate and optimize electronic and photonic system integration. For example, single crystal silicon structures having a very small mass can resonate without failure at 5 MHz for 2 billion cycles with a vibrational amplitude of plus or minus 200 nm. Accordingly, the fabrication of submicron mechanical structures with high aspect ratios would be highly desirable.

SUMMARY OF THE INVENTION

It is therefore, an object of the present invention to provide an improved self-aligned dry-etch process for the fabrication of microelectromechanical structures (MEMS).

It is another object of the invention to provide a process for fabricating structures having micrometer-scale dimensions through a simplified, single-mask, dry-etch process.

Another object of the invention is to provide a low-temperature, single-mask, dry-etch process for fabricating high aspect ratio, released structures with micrometer-scale dimensions.

Still another object of the invention is to provide an improved, low-temperature process for the fabrication of microstructures in preexisting integrated circuit wafers, such as wafers which incorporate electronic circuitry, and to provide a process for connecting such structures to preexisting circuitry.

Another object of the invention is to provide a single-mask, low-temperature, dry etch process for fabricating microstructures on single crystal substrates in which circuit elements have been constructed by a different process.

A still further object of the invention is to provide a single mask, low temperature process for making movable microstructures having deep trenches with substantially parallel walls and high aspect ratios independent of grain orientation in the substrate.

A still further object of the invention is to provide a single mask, low temperature process for fabricating mechanical actuator microstructures movable within a substrate or movable out of the plane of the substrate.

A still further object of the invention is the provision of movable microstructures in single crystal silicon, such microstructures being fabricated by a dry etch, single mask process, the structures being usable as sensors, resonators and actuators, inductors, capacitors, and the like.

A still further object of the invention is the provision of movable microstructures on single crystal silicon substrates, the structures optionally including membranes, and being used as sensor/actuators, resonators, optical reflectors, and the like movable in the plane of the substrate and rotatable out of that plane, such microstructures being fabricated by a dry etch, single mask process and by selective deposition of metal.

Briefly, the process of the present invention is a single-mask, low temperature (less than about 300°), self-aligned process for the fabrication of microelectromechanical (MEM) structures, the process allowing the fabrication of discrete MEM devices as well as the integration of such structures on completed integrated circuit wafers. The process may be used to produce a variety of sensor devices such as accelerometers, as well as a variety of actuator devices, resonators, movable optical reflectors, and the like either as separate, discrete devices on a substrate, or as components on previously-fabricated integrated circuits. The process may be referred to as the SCREAM-I process (Single Crystal Reactive Etch and Metal).

The present SCREAM-I process is a dry bulk micromachining process which uses reactive ion etching to both define and release structures of arbitrary shape, and to provide defined metal surfaces on the released structure as well as on stationary interconnects, pads and the like. The earlier process defined in the above-mentioned copending application Ser. No. 07/821,944 also permitted fabrication of microstructures, but required two masks to define the structural elements and the metal contacts.

The present invention was developed from that earlier process, but improves on it by extending the structural depth to about 10 to 20 μm, permitting formation of beam elements 0.5 μm to 5 μm in width, eliminating the second mask/lithography step of the prior process, and allowing all structural elements, including movable elements such as beams and stationary elements such as interconnects, beams and contact pads to be defined with a single mask so that the metal contacts applied to the structure are self-aligned.

The process relies, in general, on the formation of a dielectric mask on a single-crystal substrate such as silicon, gallium arsenide, silicon germanium, indium phosphide, compound and complex structures such as aluminum-gallium arsenide-gallium arsenide and other quantum well or multi layer super lattice semiconductor structures in which movable released structural elements electrically isolated from surrounding substrate materials and metallized for selective electrical connections can be fabricated using a single mask. The structure so fabricated can be discrete; i.e., fabricated in its own wafer, in which case any of the aforementioned substrate materials can be used, or it can be integrated in a silicon integrated circuit wafer, in which case the substrate material will be silicon, allowing low temperature processing in accordance with the invention.

Complex shapes can be fabricated in accordance with the invention, including triangular and rectangular structures, as well as curved structures such as circles, ellipses and parabolas for use in the fabrication of fixed and variable inductors, transformers, capacitors, switches, and the like. Released structures are fabricated for motion along X and Y axes in the plane of the substrate, along a Z axis perpendicular to the plane of the substrate, and for torsional motion out of the plane of the substrate.

In essence, the invention permits fabrication of released structures and the subsequent metallization of such structures with a single dielectric mask by using that mask to define deep isolating trenches completely around the structures, undercutting these structures to selectively release them and to produce cavities at the bases of surrounding mesas, and then metallizing the exposed surfaces. The undercutting and cavity formation breaks the continuity of the deposited metal, thereby electrically isolating the metal on released structures and defined mesas from the metal on the bottom of the trenches, and a dielectric layer isolates the metal from the underlying substrate. The elements defined by the trenches are interconnected by the metal layer so that released structures can be electrically connected through the metal layer to pads in the surrounding mesas, with interconnects provided in selected locations and with the interconnects and pads also being defined by the trenches.

When the single mask process is carried out on a discrete substrate or wafer, the process can be carried out by either high or low temperature processes, but when the structures are to be integral with existing circuitry on a wafer, a low temperature process is preferred to prevent damage to the existing circuitry. The process of the invention, in forming deep, narrow trenches to define the isolated and released structures produces high aspect ratio structures which can be metallized on their side walls for high capacitance between adjacent walls. In addition, the process permits a deep etching below the released structures to reduce parasitic capacitance between the released structures and metal on the trench floor. The etching process also produces extended cavities in the side walls of the mesas surrounding the released structures so reduce leakage current between metal on the side walls and on the trench floor. The metallization on the released structures cooperates with metallization on mesa side walls and metallization on the trench floors to capacitively control and/or sense horizontal and vertical motion of the released structure.

If desired, it is also possible to carry out additional steps after completion of the single mask processing described above to modify the resulting structure. For example, an additional masking step can permit reduction of the spring constant of a released beam. In addition, a membrane can be added to released structures to increase their weight for use in accelerometers, and these membranes can be polished for use as movable mirrors. Additional steps may be used to connect metal layers to external circuitry, as by way of vias, and plural layers can be fabricated to form superimposed structures.

A wide range of devices can be fabricated utilizing the process of the present invention. As noted above, the process is independent of crystal structure in the substrate, so that essentially any shape can be fabricated and released. Thus, single or multiple fingers cantilevered to a side wall of a substrate and extending outwardly over a trench bottom wall, various grids and arrays can be fabricated and various electrical components can be formed. These various structures may be referred to herein as "beams" or "released beams", it being understood that such beams or released beams can be of any desired shape and can be single or multiple structures.

The metallization of selected walls and surfaces of the beams and surrounding substrate allows capacitive control and sensing of horizontal motion in the released structures while metallization of the trench bottom wall allows control and sensing of vertical motion by providing a relatively wide released structure, for example in the form of a grid or plate, supported axially by single beams to a surrounding mesa wall, and by selectively applying a potential between one side or the other of the plate and the metal on the trench bottom permits torsional rotation of the plate about the axis of its supporting arms. Such a torsional rotation of a plate has numerous applications; for example, in optics.

The released structures of the present invention can be in the form of, for example, a single beam which serves as an accelerometer or a sensor and which is movable horizontally and vertically or in the form of plural beams in side by side parallel arrangement, or in various other arrays. Plural beam structures can work together, for example moving horizontally toward and away from each other to form "tweezers" or can have varying characteristics, such as thickness, to provide varying responses and thus to provide a wide range of motion or sensitivity in, for example, an accelerometer. Various grid-like arrays may be provided to add mass or to provide torsional motion as described above, the process of the present invention permitting an exceptionally wide variety of arrays.

An example of the use of structures fabricated in accordance with the process of the present invention is in torsional resonators fabricated from single crystal silicon. Micromachined resonators have been employed in a wide range of sensor applications, and in such applications the most important resonator characteristic is mechanical dissipation. Often, a sensor application requires operation of a resonator in a gas or liquid medium such as air and because of their small mass, such resonators are expected to have their dissipation determined by the surrounding medium. Torsional resonators fabricated of single crystal silicon in accordance with the invention have a lower mechanical dissipation, and thus are valuable in this application. Furthermore, torsional resonators constructed in accordance with the present invention undergo motions out of the single crystal silicon wafer plane and are capable of large motions in this direction. Such out of plane motion presents potentially useful actuator and rotating mirror applications.

The basic process of the present invention can be outlined as follows.

First, a dielectric layer of oxide or nitride is deposited on a wafer or substrate, this layer serving as a mask throughout the remainder of the steps. A standard PECVD process is used because of its high deposition rate and low deposition temperature. Thereafter, resist is spun, exposed and developed on the mask layer. Standard photolithographic resist techniques are used to define the desired beams, pads, interconnects and like structures. Thereafter, the pattern produced in the resist is transferred from the resist to the mask dielectric using, for example, $CHF_3$ magnetron ion etching (MIE) or RIE.

An $O_2$ plasma etch may be used to strip the resist layer, and the patterned dielectric mask is then used to transfer the pattern into the underlying wafer to form trenches around the desired structures. A deep vertical reactive ion etch (RIE) or chemically assisted ion beam etch (CAIBE) is required for this purpose. Depending on the choice of structure height, the trenches may be from 4 to 20 $\mu$m deep, with substantially vertical, smooth walls.

After completion of the trenches, a protective conformal layer of PECVD oxide or nitride is applied to cover the silicon beams/structures to a thickness of about 0.3 $\mu$m thick. The conformal dielectric layer covers the top surfaces of the surrounding substrate (or mesa), the defined structures, and the sides and the bottom wall of the trench, so it is necessary to remove the dielectric from the trench bottom wall, as by an anisotropic $CF_4/O_2$ RIE at 10 mT. This etch does not require a mask, but removes 0.3 $\mu$m of dielectric from the beam and mesa top surfaces and from the trench bottom, leaving the side wall coating undisturbed. As a result, the beam is left with a top surface layer and a side wall layer of dielectric, with the bottom of the trench being film-free.

A deep RIE or CAIBE is then used to etch the trench floor down below the lower edge of the sidewall dielectric. This etch preferably exposes 3 to 5 $\mu$m of substrate underneath the dielectric on each side of the beams and under the dielectric on the walls of the surrounding mesa, and it is this exposed substrate under the beams and on the mesa walls which is to be removed during the release step. The release is carried out by an isotropic RIE which etches the substrate out from under the beams or other structures, thus releasing them, and etching the substrate on the mesa walls to form cavities. The etch has high selectivity to the dielectric, allowing several microns of substrate to be etched without appreciably affecting the protective dielectric coating. After release, the beams are held cantilevered over the bottom wall of the deep silicon trench by their connections to the surrounding mesa at their ends, for example.

Each released, cantilevered structure has a core of semiconductor material such as single crystal silicon and a conformal coating of dielectric surrounding it on the top surface and side walls. The structural beams may be cantilevered at the ends and free-floating in the center, for example. To activate the structure, either by measuring its motion or by driving it into motion, a metal layer is required. Accordingly, as a final step, an aluminum layer is sputter deposited onto the beam top surface and side walls of the beam, onto the floor of the trenches, and onto the top surface and side walls of the surrounding mesa. The structure is now complete and simply needs to be connected to suitable circuitry to activate it. The circuitry may be on a separate substrate or may be formed in the wafer adjacent the location of the beam prior to fabrication of the beam. It may also be desirable, depending on the application, to add a thin passivation oxide layer 100 to 200 nm thick to prevent shorting between moving structures.

In designing and fabricating a single-mask MEM device using the present invention, only a single layer of metal is used because of the simplified nature of the process. Furthermore, in addition to surrounding the beams, a trench must surround every electrically complete set of interconnects, contact pads and capacitive plates. This trench serves a dual purpose. It isolates and defines the individual structured elements such as the beams, pads and conductors and, because of the self aligned nature of the process, the trench automatically patterns the metal. Released MEM beams normally are narrow to facilitate the release step and to provide flexibility and light weight, while interconnects formed by the same process normally are wider to prevent release and to provide stable support for the released beam. Beams destined for release typically would be about 1 $\mu$m wide and preferably less than a maximum of between 3 and 5 $\mu$m. Interconnects typically are not meant to move, and thus can be wider than 5 $\mu$m.

Because of the low temperature requirements of some embodiments, the simple design rules and the short process times of the present invention, the process described herein can be added to conventional very large scale integrated circuits without damaging such circuits or interfering with their construction. One of the benefits of the present process is the ability to define all the electrical components with a single mask. In prior processes, after every metal deposition, a photolithography step became necessary to etch back the metal and define the interconnects. In the present invention, the etch back is not necessary, for the metal runners are self aligned and self-defined.

BRIEF DESCRIPTION OF THE DRAWINGS

Although the foregoing and additional objects, features and advantages of the present invention will become apparent to those of skill in the art from the following more detailed description of a preferred embodiment, taken in conjunction with the accompanying drawings, in which:

FIGS. 1A–1J illustrate steps 1 through 10, respectively, of the process of the present invention;

FIGS. 8A–8L illustrate the steps of a fifth embodiment of the invention;

DETAILED DESCRIPTION OF THE INVENTION

Figure 1I:
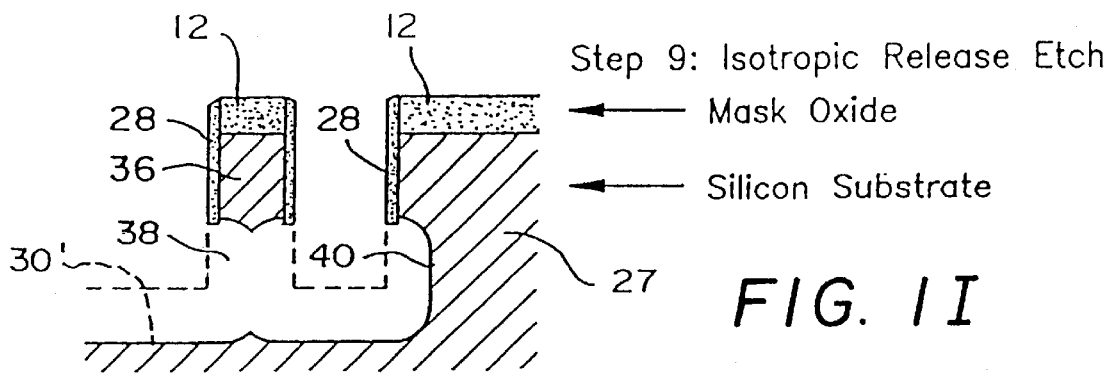

Although a number of variations on the basic process of the present invention are described hereinbelow, the basic process is capable of fabricating a functioning MEM structure with a single mask. The basic process and its variations all rely on the characteristics of single-crystal structures for the substrates, and further depend on the use of standard fabrication tools, on the use of optical or E-beam lithography and on self-aligned construction. The invention permits definition of high-aspect-ratio structures having walls closely spaced to corresponding walls on a substrate for high capacitance between the adjacent walls. The basic process is illustrated in steps 1 through 10 of FIGS. 1A through 1J, respectively, of the drawings, which outline a single-mask, low-temperature, self-aligned process for making micro-electromechanical structures. These figures illustrate the fabrication of a released, cantilevered beam which is free to move left or right in a generally horizontal path (as viewed in the Figures), and illustrate an adjacent vertical static plate which forms a parallel capacitor plate to measure the motion of the beam or, in the alternative, to cause motion of the beam.

The illustrated process is implemented with a single mask, with the structure being fabricated as a discrete element on a wafer or die. As previously noted, a discrete element is defined as an element on a wafer without electronic circuitry but which has bonding/contact pads that will be wire-bonded to external circuitry. Another embodiment of the invention, discussed below, relates to fabrication of an integrated element which, as used herein, refers to a structure fabricated on an integrated circuit chip and directly connected to on-chip circuitry through interconnects or vias.

The following Table I outlines the process of the present invention, as will be described more fully hereinbelow.

TABLE I

| Step Number | Description (Single Crystal Silicon) | Description (Gallium Arsenide) |
|---|---|---|
| 1. Mask dielectric | PECVD (1–2 $\mu$m) oxide or nitride | PECVD oxide or nitride |
| 2. Photolithography | Vapor prime Spin & bake resist Expose Develop Descum | Vapor prime Spin & bake resist Expose Develop Descum |
| 3. Pattern transfer | CHF$_3$ MIE | CHF$_3$ MIE |
| 4. Resist removal | O$_2$ plasma | O$_2$ plasma (Optional) |
| 5. Trench etch #1 | Cl$_2$ RIE | Cl$_2$ CAIBE |
| 6. Sidewall dielectric | PECVD (0.3 $\mu$m) oxide or nitride | PECVD oxide or nitride |
| 7. Clear floor dielectric | CF$_4$ RIE | CF$_4$ RIE oxide or nitride |
| 8. Trench Etch #2 | Cl$_2$ RIE | Cl$_2$ CAIBE |
| 9. Release | SF$_6$ RIE | BCl$_3$ RIE |
| 10. Sputter metal | Aluminum or equivalent metal | |
| 11. Wire bond | | |

Steps 1 through 10 of the Table correspond to steps 1 through 10 of FIG. 1. Two processes are outlined in the Table, one for single crystal silicon substrates and the other for Gallium Arsenide substrates. The following description refers first to a process for fabricating single crystal silicon.

Referring now to FIG. 1A, in Step 1 of the process, a clean, open area of bare silicon such as a top surface 8 of a single crystal silicon wafer 10 is provided, on which is deposited a layer 12 of oxide ($SiO_2$), this layer serving as a mask throughout the remainder of the steps. Although this oxide may be grown in a furnace, this would be suitable only for discrete elements, for the formation of a thermal oxide requires temperatures of 1000° or more, which would damage any electrical elements on the wafer. The oxide layer 12 can be deposited by PECVD or by some combination of PECVD and thermal growth, but a standard PECVD process is preferred because of its high deposition rate and the fact that it has a low deposition temperature, in the range of 300–500°, which is suitable for fabrication of integral elements on wafers carrying electrical components. The minimum oxide thickness is determined by how fast the later RIE steps (to be described) will etch the oxide, but in general, the oxide mask layer can be a great deal thicker than the required minimum thickness. In a typical process where the beam or other structure height is to be 10 μm, a thickness of about 0.7 μm is desirable for the oxide.

The height of the structure to be fabricated is, more precisely, the height of a silicon "skeleton" which will be located inside the oxide-coated released beams fabricated by the present process. This silicon skeleton is the major component of the beams produced by the process and, as noted above, typically can have a height of about 10 μm or more with a minimum height of about 3 μm.

Step 2, illustrated in FIG. 1B, is a photolithography step wherein a resist material 14 is spun onto the top surface 16 of the mask oxide, is exposed, and is developed, using standard optical photolithographic resist techniques to produce a pattern 18. Optical techniques are preferred, since a resolution of less than about 0.5 μm generally is not required; however, if better resolution is needed, electron beam lithography with a tri-level resist and an aluminum lift-off mask can be used.

Using the pattern 18 developed in the resist, the underlying oxide layer 12 is etched to transfer the pattern to the oxide mask, as illustrated in FIG. 1C, Step 3. As there illustrated, the oxide layer 12 is etched using, for example, $CHF_3$ in a magnetron-ion etching (MIE) machine. Such etching is virtually identical to RIE, except it utilizes a large magnet which concentrates the plasma and increases the etch rate. The high etch rate of MIE helps to prevent resist burning. In addition, the MIE etches at a very low pressure (about 1 to 3 mTorr), provides vertical side walls and increases throughput. The pattern 18 formed in the resist material 14 is thus transferred to the mask oxide 12, as illustrated by mask pattern 20.

The resist material is not used to mask the pattern 18 directly onto the silicon substrate 10 because the $Cl_2$ etch (to be described), which is used to dig the trenches in the silicon to form the beam structures, etches resist material much more quickly than oxide. Thus, the use of an oxide mask allows the silicon etch to last longer and to dig deeper than could be done with the same thickness of resist.

Following the pattern transfer of step 3, the resist material is stripped, as illustrated in Step 4, FIG. 1D. The resist is removed in known manner as, for example, by an $O_2$ plasma etch utilizing a "barrel asher", wherein ionized oxygen radicals attack the resist, or by utilizing a wet chemical resist strip using a chemical solvent that dissolves the resist. The $O_2$ plasma etch is preferred since it is fast, removes the resist completely to leave a clean surface, and has a high throughput.

The deep silicon etch illustrated in step 5 (FIG. 1E) is critical to the process of the present invention. This is a deep silicon etch in which the pattern 20 is transferred into the silicon 10 by a deep, vertical anisotropic $BCl_3/Cl_2$ RIE to form deep trenches 22. The etch is carried out in three steps in a standard RIE chamber, as illustrated in the following Table II.

TABLE II

| Parameter | Step 1 | Step 2 | Step 3 |
|---|---|---|---|
| Power: | 200 Volts | 300 Volts | 475 Volts |
| Pressure: | 20 mTorr | 20 mTorr | 40 mTorr |
| Time: | 1 min. | 1 min. | (user defined) |
| Chemistry: | | | |
| $Cl_2$ | 0 sccm | 2 sccm | 50 sccm |
| $BCl_3$ | 14 sccm | 14 sccm | 5 sccm |
| $H_2$ | 7 sccm | 7 sccm | 0 sccm |
| Etch Rate: Si | 1900Å/min. = | 11.4 μm/hr | |
| Etch Rate: $SiO_2$ | 96Å/min. = | 0.576 μm/hr | |
| Selectivity: | 20:1:Silicon:Oxide | | |

Because of the very high selectivity in the main $Cl_2$ etch, in the range of 20 to 1 for silicon and silicon oxide, the presence of a native oxide can cause unwanted masking. Therefore, the first two etch steps are used to attack and remove the first 10 to 20 μm of oxide, while the third step is used to carve out the silicon trench. The $BCl_3$ gas etches oxide, while the $Cl_2$ etches silicon. A better selectivity in the etch could be obtained by eliminating the $BCl_3$ and using pure $Cl_2$ so that 40 μm of silicon would be etched for every 1 μm of oxide. However, any small pieces of oxide that might fall into the trench would act as an undesired mask because of this selectivity. This commonly happens during etching, with sputtered pieces of oxide falling into the trench and acting as minute masks. The $BCl_3$ etches the oxide that falls into the trench and thus improves the quality of etch.

The $Cl_2/BCl_3$ etch has an additional effect which is very helpful; namely, in situ side wall thin film deposition. This etch deposits a thin layer 24 of silicon dioxide on the side wall and bottom of the trenches during the etch, and this thin layer acts as an additional side wall mask which can be used in subsequent steps.

At this point in the process, as illustrated in FIG. 1E, deep trenches 22 have been carved into the substrate 10, following the pattern 20 of the mask oxide 12. A cross-section of the substrate, such as that shown in FIG. 1E, reveals one or more silicon islands 26 (only one of which is illustrated) surrounded by trenches which separate the islands from the surrounding substrate which forms a mesa 27. The islands can be any selected width, for example about one micron, can be several microns tall, can be hundreds of microns long, and can be in any desired shape or pattern, as established by the photolithograph step. The islands 26 and the surrounding substrate 27 may both be referred to as mesas, and each has an oxide mask 12 on the mesa top and a thin oxide layer 24 on the side walls caused by the $Cl_2$ etch. The core of the island 26 is single crystal silicon, as is the substrate 10 which forms mesa 27.

In order to release the island structures, a protective film is provided on the top surface and on the side walls, with the trench bottom being bare silicon so that an isotropic RIE can be used to etch the silicon out from under the islands to form cantilevered or free standing beams, and to etch the silicon out from under the surrounding mesa to form undercut cavities.

More particularly, a protective film for the silicon islands and surrounding mesa is provided in accordance with step 6, illustrated in FIG. 1F, wherein the entire wafer is coated with a protective oxide layer 28, using a standard plasma enhanced chemical vapor deposition (PECVD) process. This is very similar to an RIE, except that the gases which flow into the chamber react to form films, rather than attack them. SiH$_4$ and NO$_2$ react to form silicon dioxide and NH$_3$, with the individual molecules of silicon dioxide bonding to the surface of the wafer and forming a thin film of oxide. The reaction is very conformal; that is, it covers all surfaces with an equally thick layer, regardless of angle or orientation. The layer of oxide 28 illustrated in FIG. 1F incorporates the thin layer 24 illustrated in FIG. 1E. In accordance with this process, the layer 28 extends over the mask layer 12 so that the thickness of the silicon dioxide on the island and mesa tops is thicker than that at the floor 30 of the trenches 22.

As illustrated in FIG. 1G, in step 7 of the process the oxide layer 28 on the floor 30 of the trenches is removed by an anisotropic CF$_4$/O$_2$ RIE. This etch carves straight down, with very little lateral influence and is easily done with a low pressure RIE. This effectively removes one layer from every horizontal surface; in this case, the island and mesa top surfaces and the trench bottom, and does not affect the side walls, thereby leaving an oxide layer that covers the top and sides of the island 26 and surrounding mesa 27, but leaves the floor 30 open, as illustrated in FIG. 1G.

With the trench floor 30 film-free, a second anisotropic Cl$_2$/BCl$_3$ RIE silicon etch is carried out, as illustrated at step 8 in FIG. 1H. At this point, the mask and side wall oxides 12 and 28 are in place on the mesas 26 and 27 and only the trench floor is film-free silicon. This second silicon etch adds about 3 to 5 $\mu$m of depth to the trench bottom 30; that is, the trench bottom is etched 3 to 5 $\mu$m below the lower edge 32 of the side wall oxide layer 28, thereby exposing 3 to 5 $\mu$m of side wall silicon 34. This etch facilitates the next following isotropic release etch (step 9) by exposing the silicon at the bases of the islands 26. This etch has three benefits; it facilitates the release of the structures, it lowers the trench floor to control the spacing between the beam, when it is released, and the floor, and it prevents excessive upward etching of the structure behind the side wall oxide coating 28.

Step 9, FIG. 1I, illustrates the isotropic release etch step which separates and releases the islands from the underlying substrate to produce released beams such as the beam 36, which may, for example, be connected at one end to extend in a cantilevered fashion over the floor of the trench. This etch step is an SF$_6$ isotropic high pressure, low power RIE process which attacks the silicon at the trench floor 30 and the lower side wall portion 34 to etch the silicon from under the mesas in the region 38 indicated by the dotted lines. The island 36 is narrow in the region of the etch so it is fully released. The SF$_6$ etch also etches out a cavity 40 in the side wall of the substrate mesa 27, adjacent the location of the beam 36, the upper portion of the mesa side wall being protected by the oxide layers 12 and 28, discussed above, creating a new trench floor 30'.

It is noted that although the second silicon etch of step 8 is preferred, it is not essential because the SF$_6$ release etch of step 9 can etch downwardly through the floor 30 of the trench and eventually will etch away under the mesas. However, this takes an additional amount of etching time because the SF$_6$ etchant reaction is "transport limited"; that is, the etchant can't reach the surfaces to be etched fast enough in the narrow trenches. In contrast, the SF$_6$ etch will be more efficient if step No. 8 is included, for in that case a large, open silicon side wall is presented which allows lateral etching to begin immediately to minimize the required SF$_6$ release time.

By including step No. 8, the vertical distance between the released beams 36 and the trench bottom 30 (FIG. 1I) can be controlled. If step No. 8 is excluded, the beam to floor distance will depend only on the SF$_6$ release time, but by adding a silicon etch before the release this distance can be increased as required.

It has been found that as the SF$_6$ etchant begins to etch underneath the mesas 24, it begins to reach up underneath the beams, within the protective layers 28, since the etchant etches in all directions equally. Normally, a plasma etch is directed toward to the surface to be etched with an accelerating potential which drives the etchant down to the substrate, so an RIE normally is an inherently directional etch. However, isotropic etching can be obtained by increasing the pressure so that the directionality is less evident and lateral etching is more evident, and the present invention preferably utilizes a sufficiently high pressure to make the release more isotropic than directional and to rapidly undercut the island.

If the deepening of step 8 is not used, the initial distance from the undersurface of beam 36 to floor 30 will be from 3–5 $\mu$m. However, if the etch of step 8 is used, this distance increases to between 5 and 9 $\mu$m from beam 36 to floor 30' by the end of the etch. The increase in the distance between the beam and the floor of the trench during the etching process also limits the upward etch rate under the protective oxide layers 28, thus ensuring a high aspect ratio for the released beam 36.

Figure 1J:
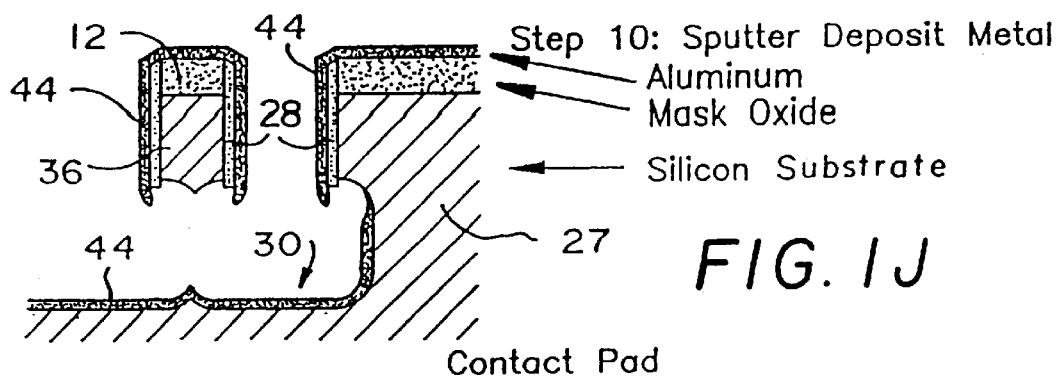

As illustrated in step 10, FIG. 1J, a sputter deposition of aluminum can be used to provide metallization of the beam top surface and side walls, as well as the surface and side walls of mesa 27. Such a metal layer is illustrated at 44 in FIG. 1J, with the spacing between the beam and the floor 30 and the cavity 40 providing isolating breaks in the coating. The metallization on the top surfaces and side walls of the mesas is thus isolated from that on the floor 30 of the trenches, thereby producing a complete, electrically isolated metallized structure such as the beam 36 which can then be interconnected to suitable circuitry. It is noted that the metal layer 44 is also electrically isolated from the underlying silicon by oxide layers 12 and 28.

Figure 1K:
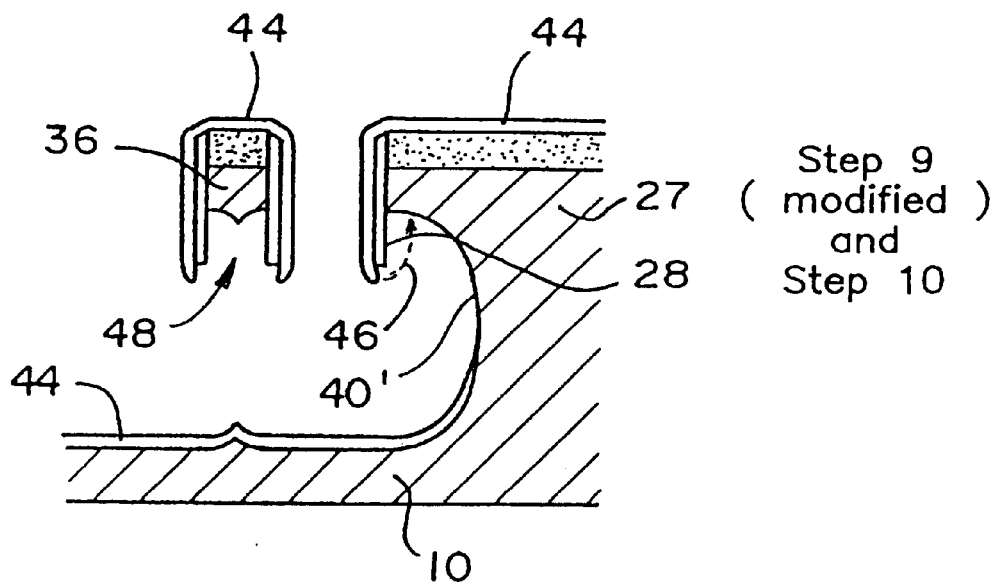
FIG. 1K illustrates a modification of Step 9 of the process.

FIG. 1K illustrates an alternative to FIG. 1I, wherein the released etch of step 9 is continued for an extended period of time to increase the depth of the trenches 22 produce an enlarged cavity 40' in mesa 27 and to increase the distance between floor 30 and the released beam 36. The cavity 40' extends upwardly behind the side wall oxide layer 28 so that when the metal layer 44 is applied (step 10) an extended leakage path, indicated by dotted line 46 is created to reduce leakage between metal 44 and the substrate silicon in the mesa 27. If desired, the etch can be continued through the bottom of the substrate to produce an aperture through the wafer in which the MEM structure such as beam 36 is suspended.

Extension of the etching time also serves to etch the bottom of beam 36, producing a cavity 48 between the beam side wall oxide and metal layers, again as illustrated in FIG. 1K. The reduced side of beam 36 reduces its mass and increases its flexibility, a feature which is highly desirable in some applications.

Figure 1L:
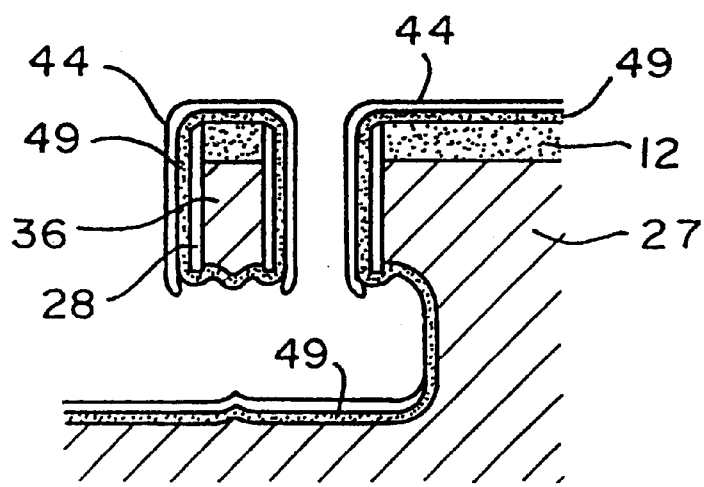
FIG. 1L illustrates a further modification of the process of steps 1–10.

FIG. 1L illustrates a further alternative to the process described in FIGS. 1A–1J, wherein a conformal dielectric layer 49 of CVD oxide or nitride is deposited on the structure of FIG. 1I before the metallization step of FIG. 1J. This conformal layer covers the top, bottom and sides of released beam 36, covers the sidewall oxide 28 on the mesa 27, and covers the floor 30' of the etched trenches, providing an insulating layer between the underlying substrate and the metallization layer 44 deposited in accordance with FIG. 1J.

A further alternative is to thermally grow oxide on the exposed silicon surfaces (floor 30' and the bottom of beam 36) of FIG. 1I to provide insulation between the metal layer 44 and the silicon substrate. However, this is less preferred, since thermal oxide is a high temperature process. Further, the deposition process of FIG. 1L provides a thicker layer of dielectric on the mesas, and increases the electrical path between the metal layer on the sidewalls and the metal on floor 30'.

The foregoing description of the process set out in steps 1 through 10 of Table I is directed to the application of the process to single crystal silicon. However, the process is also applicable to other materials, such as gallium arsenide, as set out in the corresponding right-hand column in Table I. These steps are also illustrated in FIGS. 1A through 1J, although different materials are used, as set out in the Table. Thus, for example, in step 1 the dielectric mask is a PECVD oxide or nitride, the oxide being deposited since the gallium arsenide cannot be oxidized in the manner of silicon. The dielectric may also be nitride, if desired.

The photolithography process of step 2 is the same, as is the pattern transfer of step 3. When using a gallium arsenide substrate, the resist removal process of step 4 is optional, and may not be required.

The trench etch of step 5 is a CAIBE process using $Cl_2$, rather than the RIE process used with single crystal silicon. The side wall dielectric is applied by PECVD oxide or nitride, and step 7 utilizes $CF_4$ RIE in the manner used with single crystal silicon.

The trench etch step 8 is again a $Cl_2$ CAIBE process, while the release step 9 uses $BCl_3$ RIE. With these changes, the process of the present invention can be used to produce gallium arsenide released beam structures which can be metalized in accordance with step 10 in a single mask process.

Figure 2:
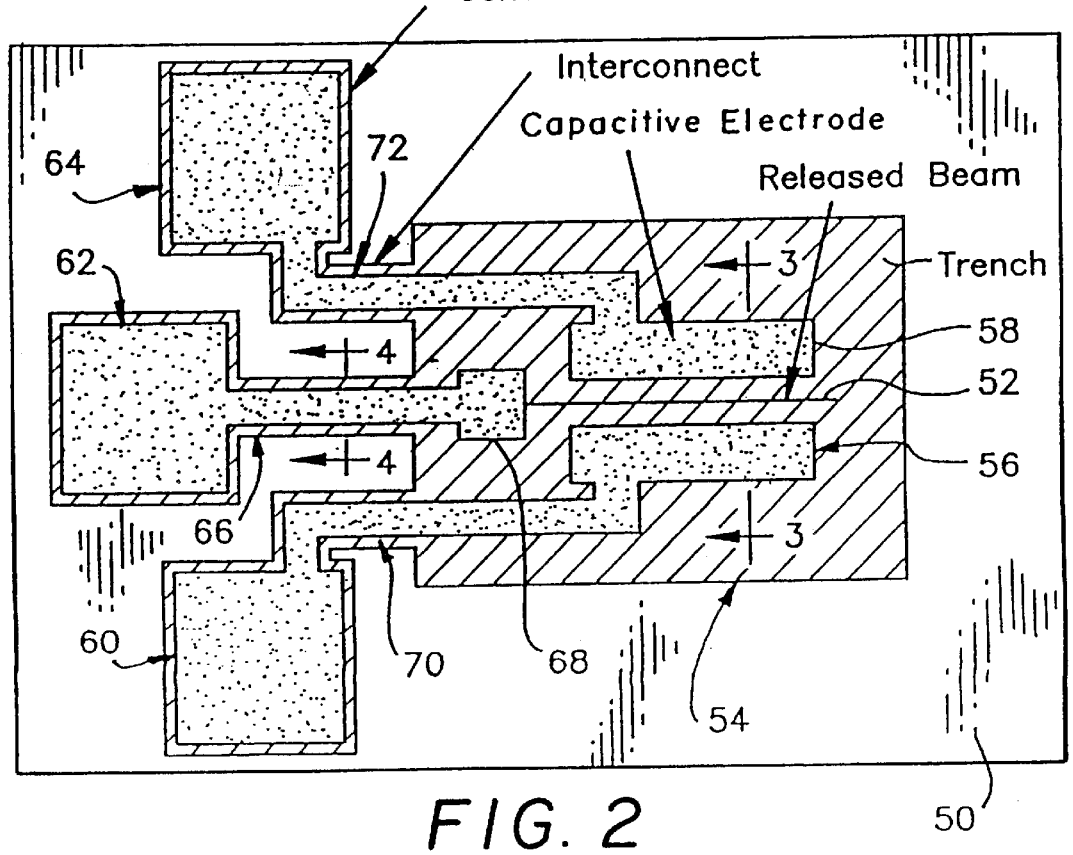
FIG. 2 is a top plan view of a beam and associated contact pads and interconnects fabricated by the process of FIGS. 1A–1J.

If the released structure is in a discrete wafer, the device may be connected as by a wire bond (Step 11 in Table I) to suitable external circuitry. A suitable structure for such wire bonding is illustrated in FIG. 2 which is a top view of a simple microelectromechanical device constructed in accordance with the process of FIG. 1. As there illustrated, a wafer 50 of single crystal silicon is patterned to produce a single released beam 52 located in a trench 54, the beam 52 being similar to beam 36 of FIG. 1J. Formed on each side of the released beam 52 by trench 54 are fixed structures such as electrodes 56 and 58, illustrated in cross-section in FIG. 3 and corresponding to mesa 27 in FIG. 1J. The cross-section is taken along lines 3—3 of FIG. 2.

Also defined by the trench 54 are additional fixed structures such as contact pads 60, 62 and 64 and their corresponding interconnects. Pad 62 is connected to the released beam 52 by way of interconnect 66, as illustrated in FIG. 4, which is a cross-section taken along line 4—4 of FIG. 2. The interconnect is illustrated as being wider than the released beam 52 of FIG. 3, and is not released from the substrate 50 so that it is stationary and provides a support wall at region 68 (FIG. 2) for mounting a fixed end of the cantilevered released beam 52. Contact pads 60 and 64 are connected to the electrodes 56 and 58, respectively, by way of interconnects 70 and 72, respectively, these interconnects being similar to interconnect 66. As illustrated, the interconnects, contact pads, and electrode supports are all formed as mesas, are covered by dielectric layers 74 and 76 on the top surfaces and side walls: respectively and are surrounded by the trench 54. Upon metallization of the device, as described with respect to FIG. 1J, a metal coating 78 will be applied between the contact pad 62 and beam 52 only by way of interconnect 66, will connect contact pad 60 to electrode 56 only by way of interconnect 70, and will connect contact pad 64 to electrode 58 only by way of interconnect 72. Thus, the trench 54 and the oxide layers 74 and 76 electrically isolate the metal from the substrate and from adjacent structures.

The metal layer 78 on the electrodes 56 and 58 includes vertical side wall portions which cooperate with the side wall portions of the metal layer 78 on released beam 52 to produce the parallel plates of capacitors. When the two electrodes 56 and 58 are located in close proximity to the beam 52, the capacitance therebetween, which is a function of distance, can be measured. Therefore, any movement of the beam 52 with respect to beams 56 and 58 can be accurately measured. The side wall parallel plates can be in the range of 10 to 20 μm tall, depending on the height of the beam 52, and can have 1 to 2 μm of interplate spacing. The beam and electrodes can be several thousands of microns in length, so that a large capacitance can be provided. Such a structure has an important use as an accelerometer by measuring relative motion of the released beam with respect to the stationary electrodes.

It is noted that the process of the present invention permits automatic definition of the metallization for the capacitors, interconnects, and contact pads without the need for additional photolithographic steps. All that is required is that the shape of these structures be established by the initial oxide layer which defines the location of the trenches, and these trenches then serve to isolate the metal from the substrate, as described above with respect to FIGS. 1A–1K. The overhanging oxide produced by the cavity 40 illustrated in step 9 (FIGS. 1I or 1K) prevents the sputtered metal from contacting the substrate and prevents leakage current between the metal and the substrate to ensure this isolation. The sputter deposition of the metal is semiconformal and will laterally deposit on the side walls, but will not deposit underneath the overhanging edges of the oxide. Accordingly, the process provides a self-aligned and self-defined movable microelectromechanical device and provides electrical connectors for that device.

Figure 3:
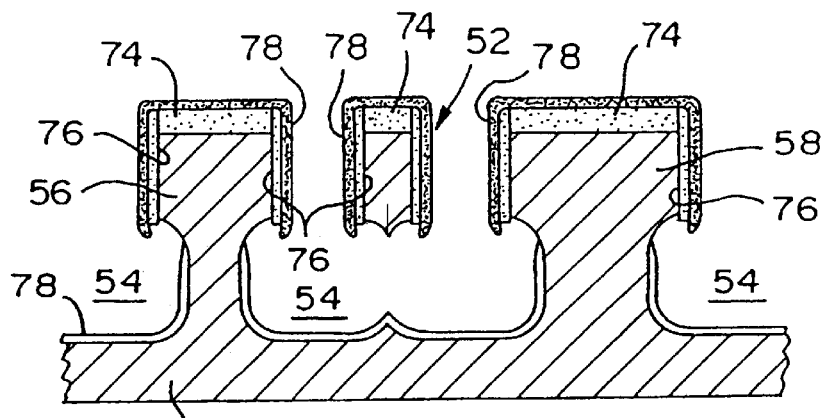
FIG. 3 is a cross-sectional view of the device of FIG. 2, taken along lines 3—3 thereof.
Figure 4:
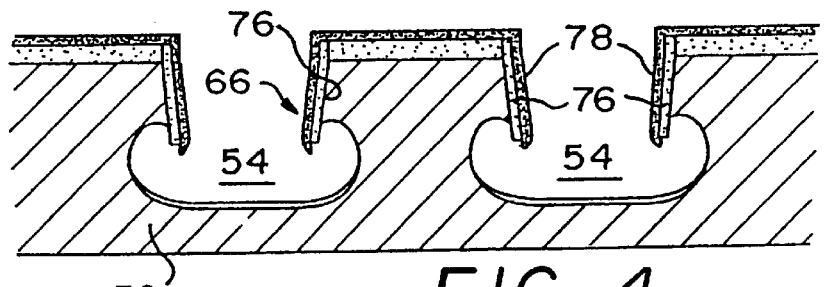
FIG. 4 is a cross-sectional view of the device of FIG. 2, taken along lines 4—4 thereof.

In addition to fabrication of the discrete structure illustrated in FIGS. 2–4, the process of the present invention permits fabrication of integrated structures, wherein released beams and other microelectromechanical structures may be interconnected with an on-chip integrated circuit (IC). In accordance with this modification of the process, which is illustrated in FIGS. 5A–5I, an integrated circuit wafer can be batch fabricated using standard integrated circuit technologies to produce desired circuits and circuit components on the wafer, and thereafter a microelectromechanical device can be fabricated on the wafer utilizing the process of the present invention without varying the standard IC technology. In this embodiment, the single crystal silicon process described above is utilized, since IC wafers are conventionally silicon. The single crystal silicon process of the invention operates at a sufficiently low temperature to permit the fabrication of released structures on existing IC wafers without thermal damage to the existing circuitry or circuit components. Of course, such a wafer could incorporate a segment of another substrate material such as gallium arsenide, if desired, in which case the alternative process of the present invention could be used, again without thermal damage to the existing circuits.

The process of fabricating microelectromechanical devices on existing IC wafers is outlined in the following Table III.

TABLE III

| Step Number | | Description |
| --- | --- | --- |
| 0a. | Photolithography | Thin Passivation region for MEM device<br>Vapor prime; spin, bake, expose, develop & descum |
| 0b. | CF$_4$ isotropic RIE | Thin passivation layer |
| 0c. | O$_2$ plasma etch | Remove residual resist |
| Steps 1–9 | | (Same as Table I) |
| 10. | Photolithography | Open via windows to buried contacts<br>Vapor prime; spin, bake, expose, develop & descum |
| 11. | CF$_4$ Isotropic RIE | Etch oxide |
| 12. | Wet chemical resist strip & O$_2$ plasma | Remove residual resist |
| 13. | Sputter metal | Aluminum (pumpdown & deposit) |
| 14. | Photolithography | Pattern top level metal<br>Vapor prime; spin, bake, long exposure, long development & descum |
| 15. | Cl$_2$ Isotropic RIE | Etch sidewall aluminum |
| 16. | Wet chemical resist strip & O$_2$ plasma | Remove residual resist |
| 17 | PECVD Dielectric | Deposit thin passivation dielectric |

In order to integrate released beams fabricated in accordance with the present invention, it is necessary that the fabricated integrated circuit die, or wafer, incorporate one or more buried metal contact pads, have a thick passivation oxide layer, and have sufficient space available for the microelectromechanical (MEM) device. Any kind of integrated circuit can be on the wafer for connection to the released structure as long as any connections to the circuit or circuit components are by way of metal pads. These pads are buried directly beneath a passivation oxide layer so that they can be accessed by way of a via etch. The passivation layer preferably is PECVD oxide across the entire wafer, and is used as the mask oxide for the fabrication process of the present invention. Such a passivation oxide is conventionally placed over a finished IC wafer as a hermetic seal against water and other contaminants during handling and thus provides a convenient beginning point for the present process. This layer is generally in the range of 0.5 to 1.0 μm thick, but if this is too thin, additional PECVD dielectric material such as oxide or nitride can be added in the fabrication process of the present invention. On the other hand, if it is too thick, or does not provide a good enough mask, then it can be removed and replaced by another PECVD oxide or nitride layer as needed. Preparation of the IC wafer prior to the fabrication of the MEM is described in steps a, b, and c, outlined in Table III, above, and is illustrated in FIGS. 5A through 5C, to which reference is now made.

An integrated circuit (IC) wafer 100 includes a passivation oxide layer 102 which is formed as a final step in conventional IC fabrication to serve as a protective layer over the wafer. The thickness of this oxide layer preferably is no less than the minimum mask requirements discussed above. The wafer includes, for example, a metal contact pad 104 located in an insulating layer 105 such as oxide, the pad being a part of an integrated circuit (not shown) and connected into that circuit in known manner. The wafer also includes a region generally indicated at 106 for receiving a MEM device. In general, the MEM device region will include a second layer 108 of oxide in addition to the passivation layer 102. This second layer is a field oxide, which is a thermally grown wet oxide placed between active devices as an isolation layer. The passivation oxide 102 is generally 0.5 to 1.0 μm thick, while the field oxide 108 is generally 0.6 μm thick.

Figure 5A:
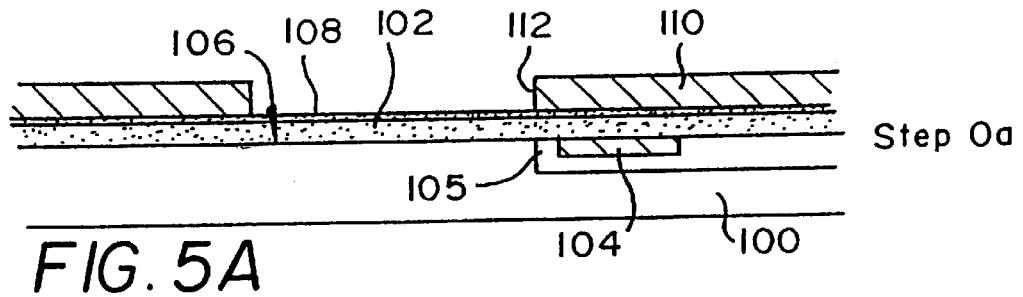
FIGS. 5A–5C illustrate optional preliminary steps for a second embodiment of the invention, wherein a MEM structure fabricated in accordance with the process of FIGS. 1A–1J is incorporated in an integrated circuit wafer.
Figure 5B:
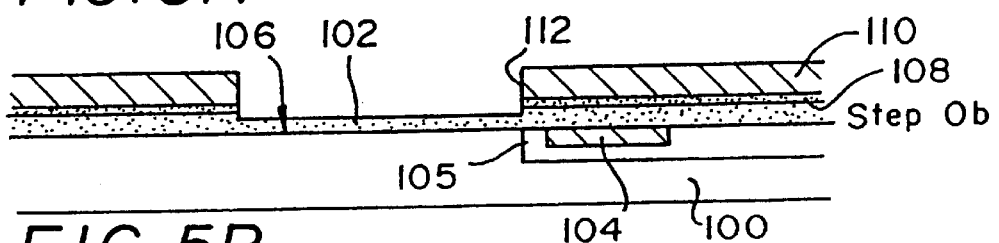
Figure 5C:
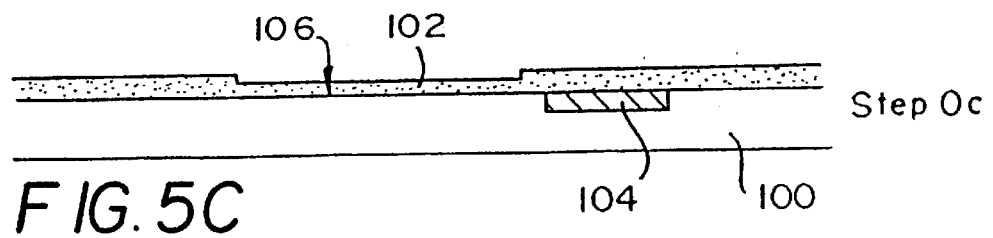

Step 0a in FIG. 5A illustrates a photolithographic step which prepares the passivation layer 102 for fabrication of the MEM device. A resist layer 110 is spun onto the top surface of the wafer, is exposed and is developed to produce a pattern 112 defining the location of the MEM device. Thereafter, the oxide layers 102 and 108 can be thinned, if required, at step 0b in FIG. 5B, as by CF$_4$ isotropic RIE, leaving only a part of layer 102, as illustrated. Alternatively, the oxide can be thickened by the addition of more PECVD oxide, if required. The residual resist layer 110 is then removed by an O$_2$ plasma etch, as illustrated in FIG. 5C. In this illustrated embodiment, the photolithographic process thins the passivation oxide in the region 106 set aside for the MEM devices, without thinning the oxide over the previously fabricated IC devices, allowing more precise control over the mask oxide thickness.

Figure 5D:
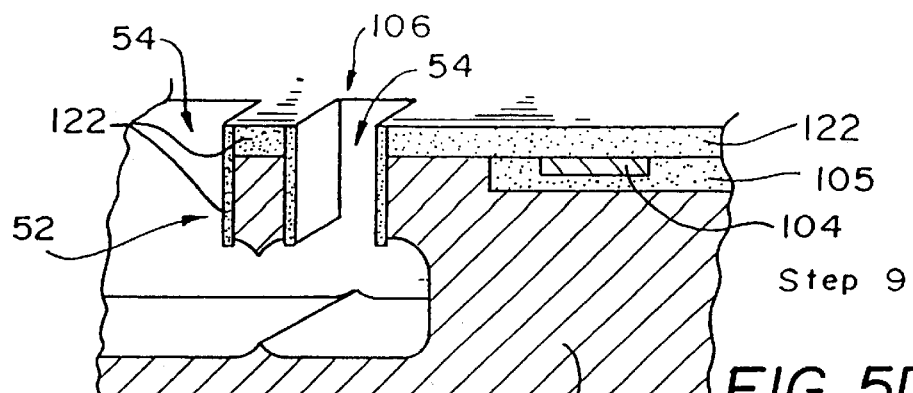
FIGS. 5D–5I illustrated additional steps for the second embodiment of the invention.
Figure 5E:
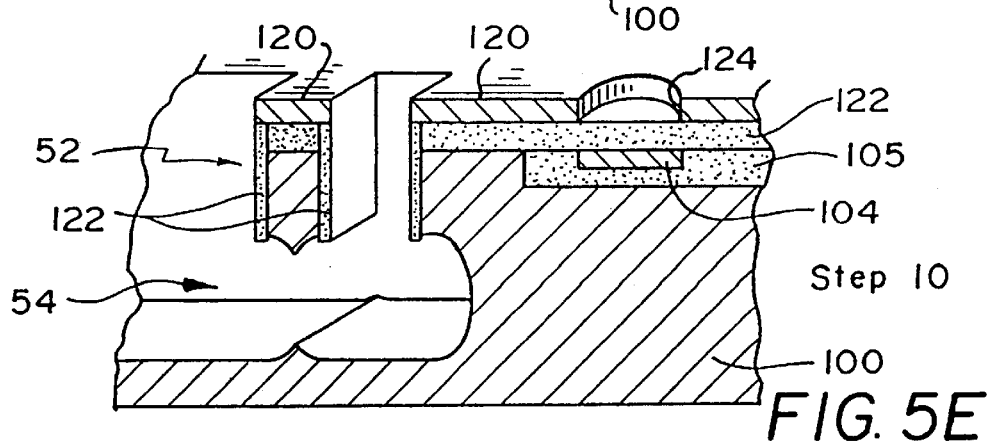
Figure 5F:
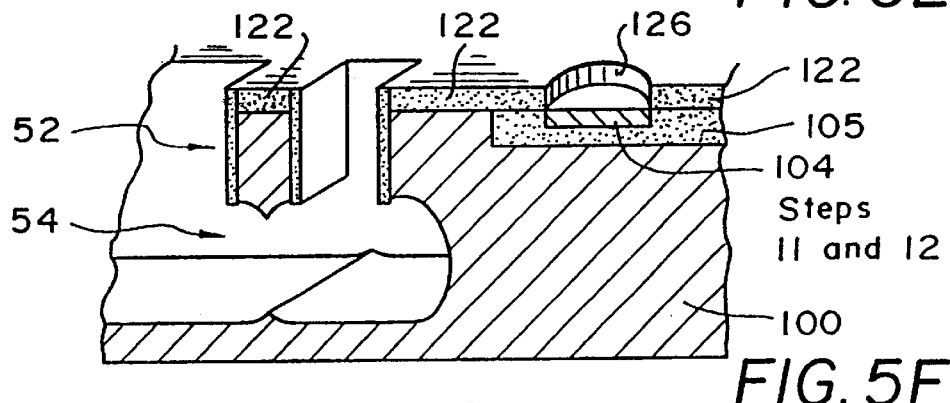

Following the preparatory treatment of the wafer in steps 5A through 5C, the MEM device is processed within the region 106 of wafer 100, following steps 1–9 illustrated in FIGS. 1A through 1I, resulting in the dielectric-covered structure of FIG. 5D (also labelled as step 9), prior to metallization. Thereafter, the process of the present embodiment includes opening a via window to the buried contact and connecting it to the MEM device. As described in step 10 in Table III, a resist 120 (FIG. 5E) is spun onto the top surface of the mask oxide layer 122, which consists of the passivation layer 102, as well as the additional oxide layers on the top surface and on the trench side walls that are added during the fabrication of the released structure in steps 1–9. The resist 120 is exposed and developed to produce a via mask opening 124 in alignment with the contact pad 104. The oxide layer 122 is etched through the via mask opening 124 as by an isotropic CF$_4$ RIE illustrated in FIG. 5F, to produce via 126. Thereafter, the resist is removed by a wet chemical and O$_2$ plasma stripping step, also illustrated in FIG. 5F as step 12, thereby exposing the contact pad through a via 126.

Step 13 (FIG. 5G) is a sputter deposition step in which a metal layer 130 is deposited on the top surface of the wafer 100 and on the floor and the side walls of the trenches 54 in the manner illustrated and described with respect to FIG. 1J.

Figure 5G:
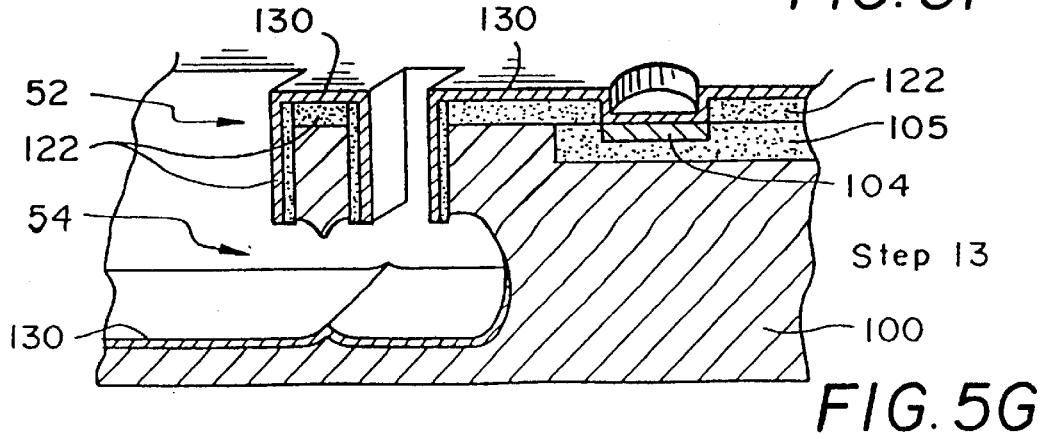

The deposited metal 130 is conformal, and coats contact pad 104 to thereby interconnect the MEM structure (for example, beam 52) with the contact 104. It will be understood that other similar contacts may also be connected to the metal layer by similar vias. Thereafter, the metal 130 is trimmed back to define the specific shape of the interconnects between the IC contact points and the MEM structure. Since the sputter deposition is conformal and deposits metal on the top surfaces, down the side walls and on the floor of all the trenches, as illustrated in FIG. 5G, it becomes necessary to pattern the metal to limit the metallization to the desired interconnections. This involves photolithography across mesa tops, side walls, and trench-bottom surfaces, and is accomplished by first applying a high viscosity resist 132 to planarize the wafer, the resist filling the trenches and protectively coating the MEM devices. A long exposure is used to pattern the thick resist material, so that the patterning can be carried out through as much as 20 micrometers of resist material. A long development time is then required to develop the exposed resist.

Figure 5H:
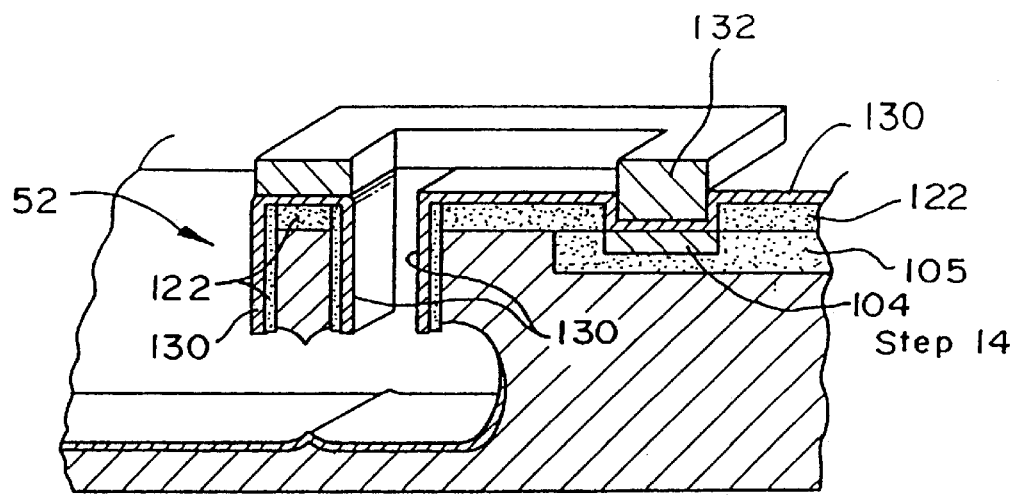
Figure 5I:
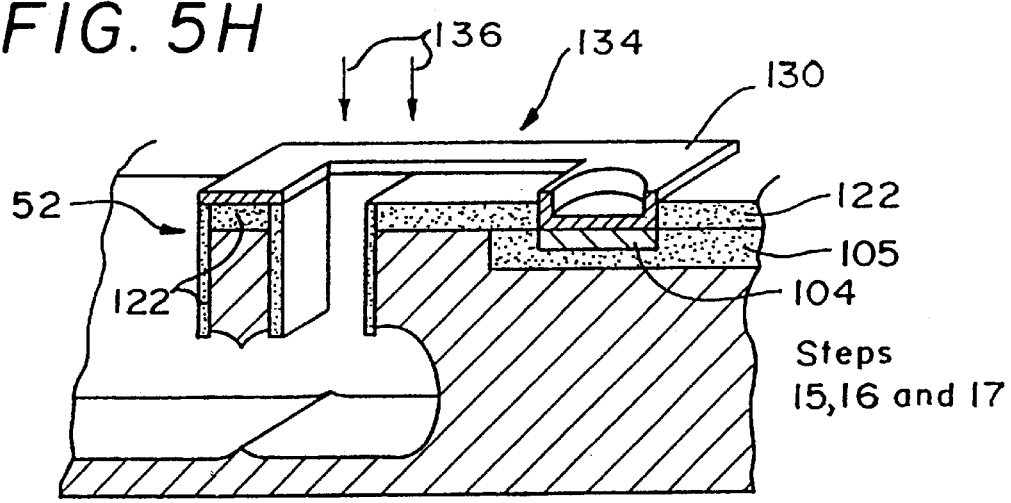

FIG. 5H illustrates the resist material 132 which remains after exposure and development in step 14 of the process. Although resolution is lost by using a thick resist, long exposure times and long development times, nevertheless the resolution obtained by this process is more than sufficient. Although to a large extent the metal layer 130 is etched by the development process, nevertheless it is preferred that following the development of the resist layer 132, an isotropic $Cl_2$ RIE is carried out to isotropically etch all exposed aluminum. Thus, the aluminum not covered by resist 132 is etched away, as illustrated in FIG. 5I at step 15, leaving the metal layer 130 only in the via 126, along the location of the desired interconnect 134, and onto the cantilevered beam 52, so as to connect the beam to the integrated circuit. The resist layer 132 is then removed by the wet chemical and $O_2$ plasma resist strip of step 16, also in FIG. 5I.

As a final step, a thin conformal PECVD dielectric is deposited on the entire surface of the wafer to insulate and passivate the devices. Note that because MEM structures are designed to move, they cannot be buried under several microns of passivation, so only about 100 to 300 nm of oxide is used for this purpose. Nitride could also be used, although it is stiffer than oxide and may inhibit motion. The oxide deposition of step 17 is illustrated by arrows 136 in FIG. 5I.

It will be noted that the interconnection of the MEM device to an integrated circuit requires additional masking steps, as illustrated in FIGS. 5E through 5I. However, the basic process for forming the MEM structure is a single mask process, as described above, and it is only the later processing that require these additional masking steps.

Figure 6:
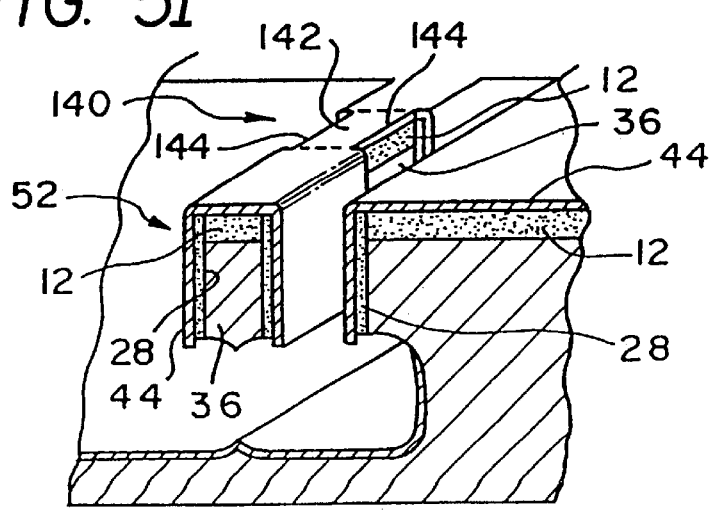
FIG. 6 is a diagrammatic view of a third embodiment of the invention.

A further embodiment of the invention is illustrated in FIG. 6, wherein an elongated, released structure such as beam 52 further is treated to increase its lateral flexibility. The beam, which is fabricated in accordance with the single-mask process of FIG. 1, includes a metal layer 44 over oxide layers 12 and 28, and these layers tend to reduce the flexibility of the single crystal silicon core 36 of beam 52. Flexibility of the beam can be increased by removing the side wall oxide 28 and the side wall metal 44 from the beam in selected locations. Since the spring constant varies with the cube of the width of the beam, such removal can reduce the spring constant by one to two orders of magnitude.

In accordance with this embodiment, a thick resist layer (not shown) is spun onto the wafer, filling in the trench around the released beam. The resist is exposed in a conventional photolithographic step and developed to expose the aluminum layer 44 in the region 140 illustrated by the dotted lines in FIG. 6. By a $Cl_2$ isotropic RIE step, the exposed aluminum is etched on the top and side walls of beam 52 in the region 140 and the residual resist material is removed by a wet chemical resist stripping step. Thereafter, a layer 142 of aluminum is evaporated only onto the top surface of the beam 52 and this evaporated aluminum together with the remaining metal layer 44 is used as an etch mask for a $CF_4$ isotropic RIE etch of the side wall oxide 28 in the regions 144 of the beam so that the beams are film-free silicon on the sides in the region 140. Accordingly, in this region the beam is as narrow as the original silicon island 36, while the top of the beam carries a thin film of mask oxide 12 and the evaporated aluminum 142 so that electrical connectivity is achieved from the contact pads to the MEM device along the top surface of spring portion 140 of the beam.

Figure 7:
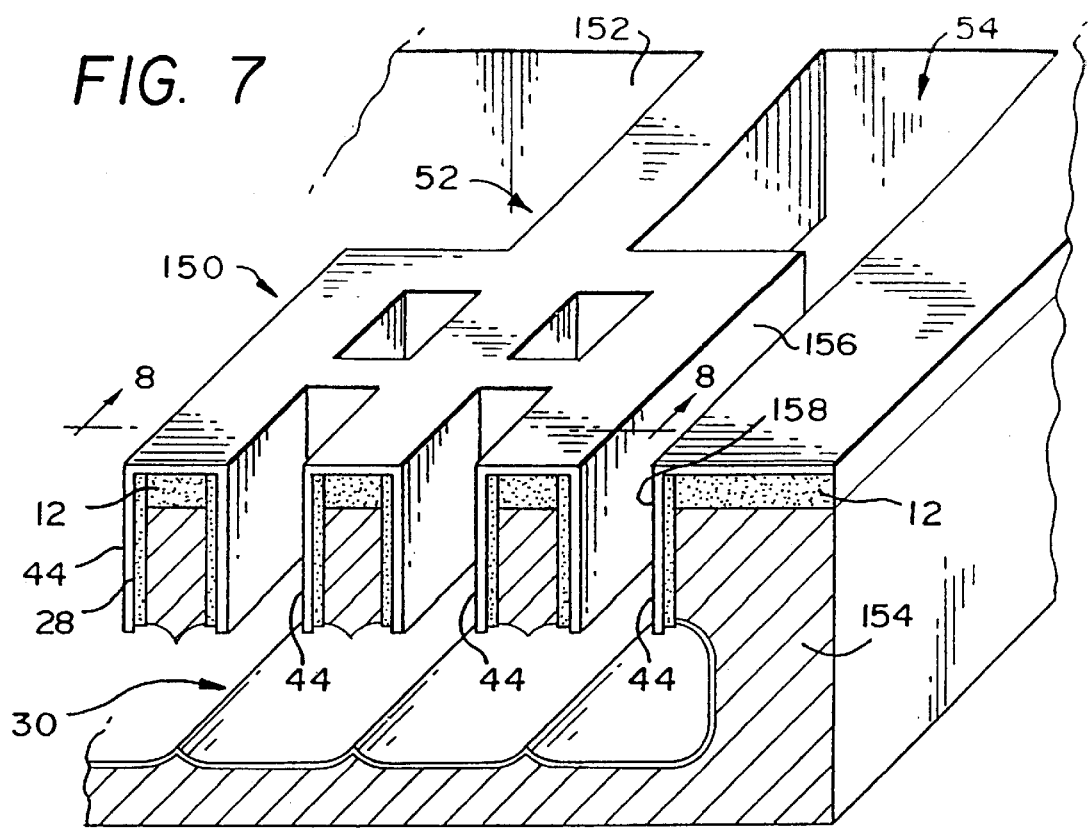
FIG. 7 is a diagrammatic view of a fourth embodiment of the invention.

An important use for the released beam 52 fabricated in accordance with the present invention is as an accelerometer, wherein flexing of the beam with respect to the capacitive electrodes, as illustrated in FIG. 2, is a measure of acceleration applied to the wafer on which the beam is mounted. In order to increase the sensitivity of such an accelerator, the beam can be made in a variety of shapes to increase its mass, for example, by adding a grid-like structure 150 to the free end of beam 52, as illustrated in FIG. 7. This grid-like structure is fabricated following the process of FIG. 1, steps 1–9, with the grid shape being determined by the initial photolithographic step. Such a grid may be of any desired width and length, and with any desired number of beams, and adds mass to the beam 52 to improve its function as an accelerometer. In large designs the grid may be 200 $\mu$m by 900 $\mu$m, with beams on 5 $\mu$m or 10 $\mu$m grid points. The beams may be from 1 to 2 $\mu$m wide with openings between them being 3 to 4 $\mu$m or 8 to 9 $\mu$m wide. The grid is illustrated as being connected to one end of a released beam 52 which is cantilevered above the floor 30 of the surrounding trench and is mounted to an end wall 152 of a surrounding mesa portion 154. However, it will be understood that the grid can be placed at the center of an elongated beam 52 which can be connected at both ends to end walls of the surrounding trench 54, the exact shape and size of the grid and its supports being dependent on the degree of relative movement desired, and thus on the desired sensitivity of the accelerometer. It will be understood that a plurality of such movable structures can be provided in a single trench 54 or in a number of trenches on a single wafer, with each having selective characteristics which may be slightly different from each other to provide a wide range of sensitivity for the accelerometer device. As illustrated in FIG. 7, the beam 52 in grid 150 are covered by a metal layer such as the 10 layer 44 provided in the process of FIG. 1 so that the metal on the side wall 156 of the grid cooperates with the metal on the side wall 158 of the mesa 154 to provide the opposed plates of a capacitor by means of which the motion of the grid with respect to the mesa can be detected or, conversely, by the application of a potential, the grid can be moved.

The mass of the accelerometer of FIG. 7 can be further increased by the addition of a layer of tungsten about 5 to 10 $\mu$m thick over the surface of the grid. The process for adding such a layer of tungsten is outlined in the following Table IV:

TABLE IV

| Step Number | | Description |
| --- | --- | --- |
| Steps 1–9 | | Same as Table 1 |
| 10. | PECVD Oxide | Deposit thin dielectric coating to prevent WSCVD |
| 11. | PECVD Silicon | Deposit seed layer for WSCVD |
| 12. | Photolithography | Pattern seed layer with thick resist Vapor prime; spin, bake, long exposure, long development & descum |
| 13. | $SF_6$ Isotropic RIE of aSi | Etch seed layer |
| 14. | Wet chemical resist strip & $O_2$ plasma | Remove residual resist |
| 15. | WSCVD | Tungsten Selective Chemical Vapor Deposition |
| 16. | Photolithography | Trim undesired tungsten with thick resist Vapor prime; spin, bake, long exposure, long development; & descum |
| 17. | Wet Chemical of W | Etch unwanted Tungsten |
| 18. | Wet Chemical resist strip & $O_2$ plasma | Remove residual resist |
| 19. | Metal Sputter Deposition (e.g. Al) | Same as FIG. 2 |
| 20. | Wire Bond | Same as FIG. 2 |

Figure 8A:
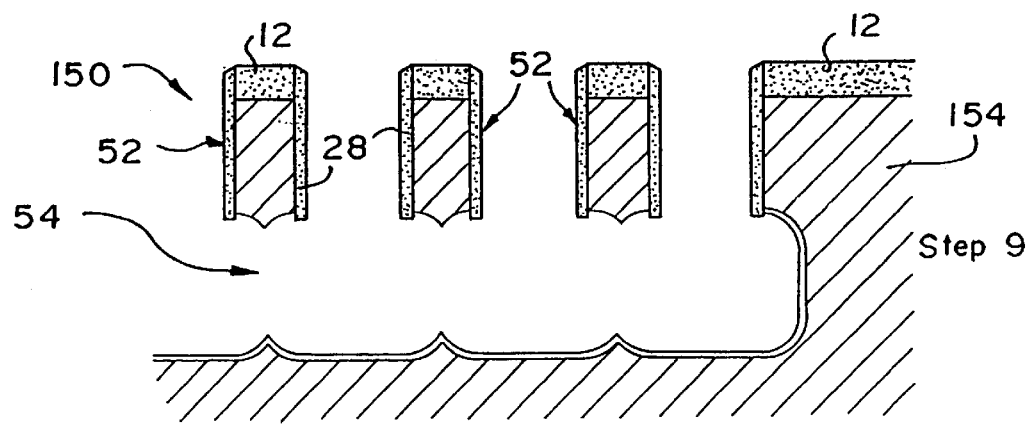
Figure 8B:
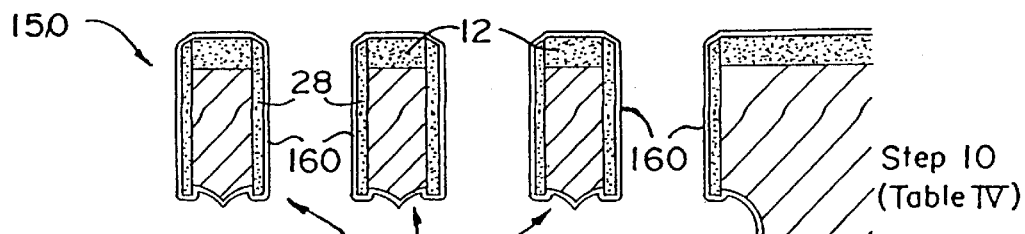

As illustrated in Table IV and in FIG. 8A, the process of applying a tungsten layer is initiated after the release of the beams at step 9 illustrated in FIG. 1I. At that point in the process, the silicon beams 52 are covered on the top and side by oxide layers 12 and 28 and the beams are cantilevered over the floor 30 of deep silicon trenches 54. The undersides of the beams and the trench floors are film-free silicon. Since tungsten does not deposit on nonmetal surfaces, an attempt to apply tungsten to the structure at this point in the process would result in the tungsten growing only on the trench floor and on the beam undersides. To prevent that, a conformal dielectric coating such as PECVD oxide 160 (FIG. 8B) is deposited on the entire wafer. This layer 160 services as an etch stop for the seed layer patterning step, and prevents the tungsten from contacting the substrate underneath the beams and on the trench floor.

Figure 8C:
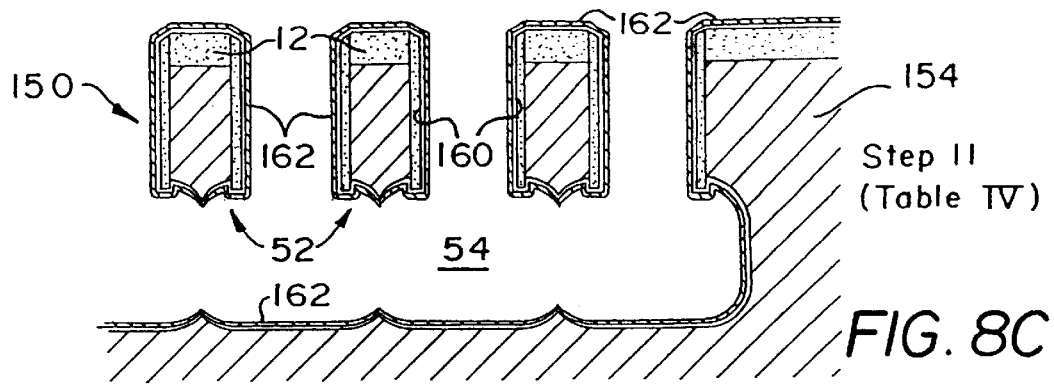
Figure 8D:
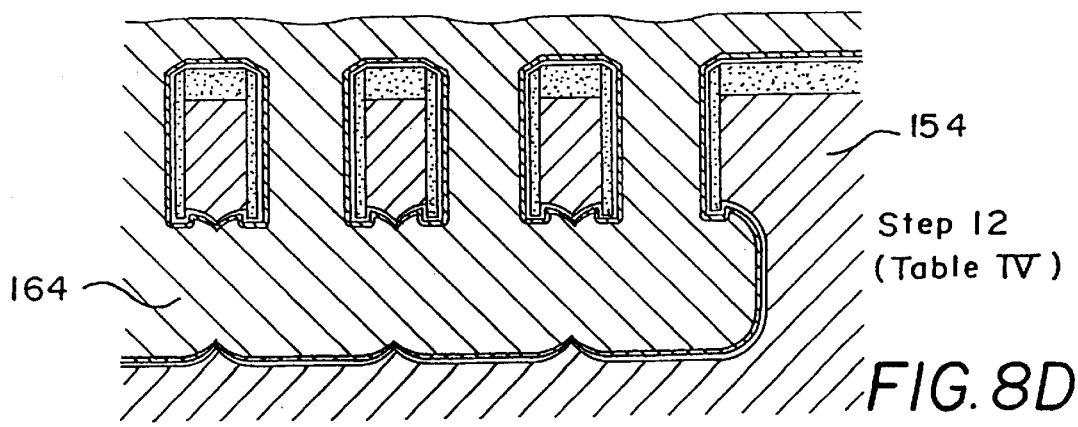
Figure 8E:
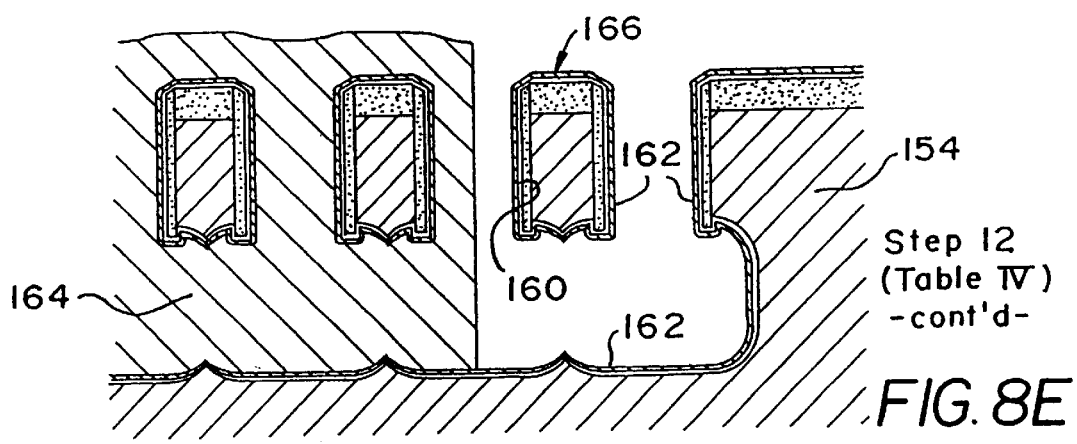

With the wafer lightly sealed off by the dielectric layer 160, a thin seed layer 162 of amorphous silicon (FIG. 8C, Step 11 of Table IV) is then deposited on the wafer, covering all surfaces. Because of the underlying dielectric layer 160, the silicon is electrically isolated from the substrate. A thick photoresist layer 164 is then applied to the wafer, filling the trench 54 and covering the grid 150 as well as the top of the mesa 154. The resist 164 is then exposed and developed, as illustrated in FIG. 8E, which is a continuation of step 12, to remove the photoresist material from areas where tungsten is not desired. Thus, the photoresist material is removed from the mesa 154 and from one of the grid beams 52, the figure showing a beam 166 freed of the photoresist layer.

Figure 8F:
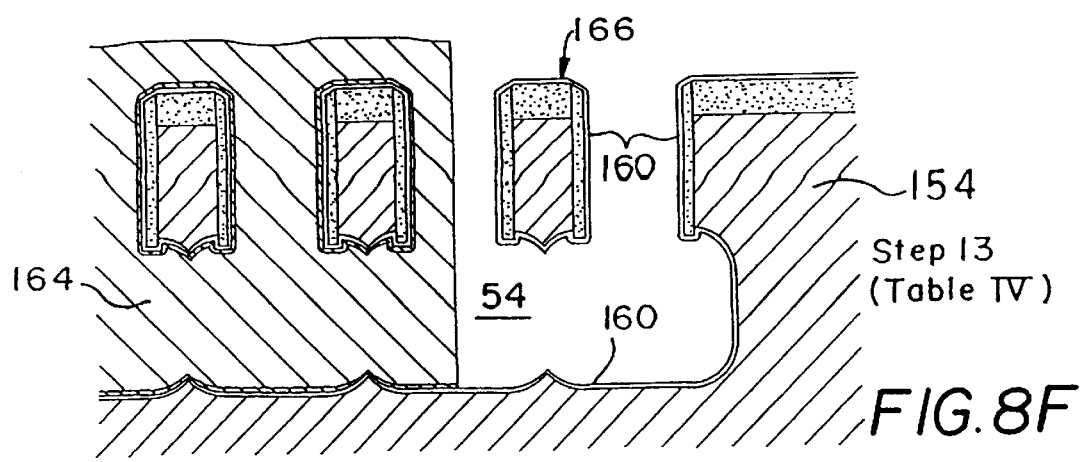

In FIG. 8E, removal of the seed layer 162 from the exposed beam 166 and from the exposed mesa 154 is illustrated. An isotropic $SF_6$ RIE removes the exposed layer 162 of silicon, with the oxide underlayer 160 serving as an etch stop. This exposes the dielectric layer 162 on beam 166 and mesa 154, as illustrated in FIG. 8F to prevent the growth of tungsten in these areas.

As illustrated in FIG. 8G, step 14 of Table IV, the resist 164 is next removed from the wafer to expose the grid 150, leaving the silicon layer 162 exposed on the beams indicated at 168 and 170 and on a portion of the floor 30 of trench 54. Thereafter, in step 15, illustrated in FIG. 8H, a tungsten selective CVD (WSCVD) is deposited, with deposition only occurring on the exposed seed layer 162 and being prevented on the oxide 160, thereby producing a tungsten layer 170 which is several microns thick on both the grid 150 and on the floor 30 where silicon is exposed. By depositing a thick layer of tungsten, a "blanket" is formed on top of the grid 150 and extends across the gaps between adjacent beams, as illustrated between beams 168 and 170 in FIG. 8H.

Figure 8K:
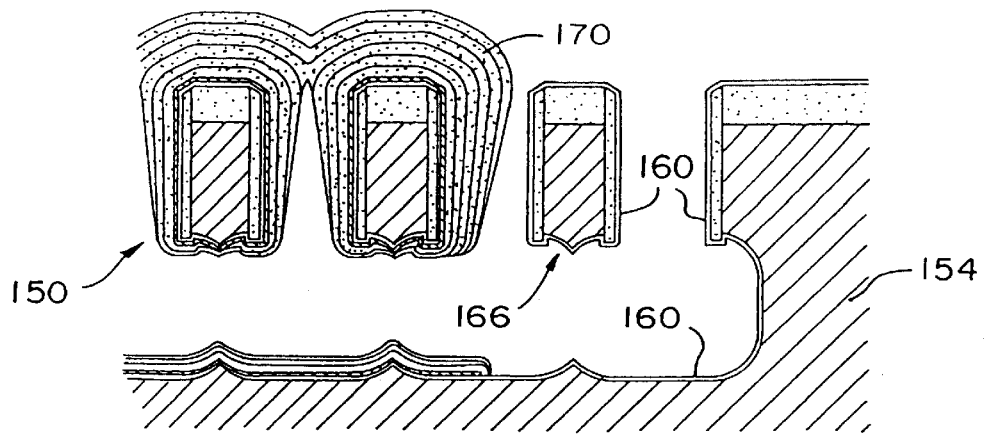

Since the process of tungsten deposition is not perfect, some tungsten will be deposited on the oxide layers 160, and therefore the same photolithographic process that was used to define the area of the tungsten is used to re-expose the areas around the grid 150 and a quick wet-chemical tungsten etch is used to clean the oxide surfaces of the spurious tungsten. Thus, as illustrated in FIG. 8I, step 16, a photoresist layer 170 is applied to the wafer, again filling the trench 54 in the region of the mesa 154 and the beam 166. The resist 172 is exposed and developed as illustrated in step 17 to uncover the oxide layer 160 so that a wet chemical etch of the unwanted tungsten can be performed in those regions. The resist 172 is then stripped (FIG. 8K), leaving a blanket of tungsten 170 across the selected part of the grid 150, as illustrated. The blanket of tungsten covers a selected portion of the top of the grid and fills in the interbeam spaces to produce the thick conformal blanket.

Figure 8L:
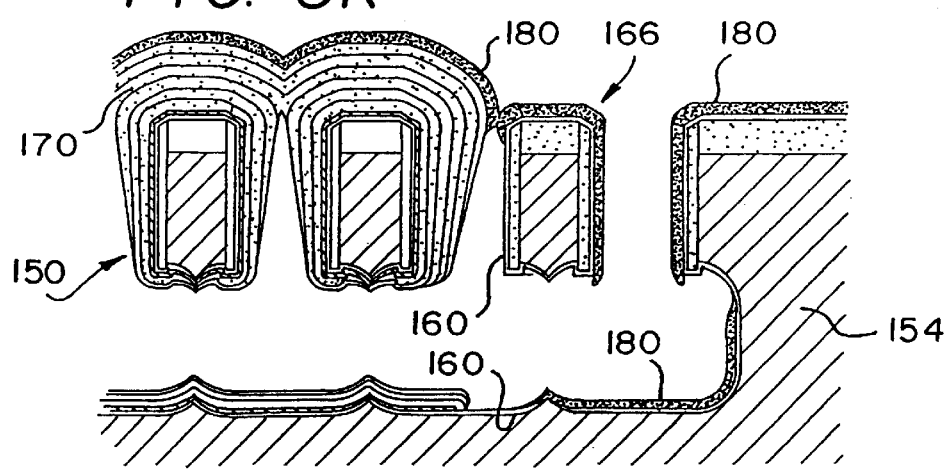

After the tungsten has been deposited on the MEM device as described above, the remainder of the device is covered by the oxide coating 160, and accordingly, the standard SCREAM-I process can be continued by a sputter deposition of metal such as aluminum, in accordance with step 10 of FIG. 1J, to produce a metal coating 180 on the opposed sidewalls of grid 150 and mesa 154, as illustrated in FIG. 8L, and as discussed above with respect to FIG. 7.

As indicated above, the process of FIG. 1A through 1I can be used to fabricated a wide variety of structures. A grid structure has been discussed above with respect to FIG. 7, and FIG. 9, to which reference is now made, illustrates another example of such a grid structure fabricated using the process of FIGS. 1A through 1I. In this case, a complex grid 200 is fabricated within a trench 202 and is secured between opposed trench walls 204 and 206 by means of axially aligned beams 208 and 210. The grid includes a plurality of longitudinal beams such as beams 212 and a plurality of cross beams such as beams 214. These beams are spaced apart to define spaced openings or apertures 216.

The grid 200 is fabricated for torsional motion, with the mounting beams 208 and 210 serving as micron-size torsion rods and the entire device being fabricated from single crystal silicon, as discussed above. As described with respect to FIGS. 1A through 1I, a sequence of dielectric depositions and reactive ion etches are used to define and release the silicon beams 208, 210, 212 and 214 from the substrate silicon 218. To produce torsional motion, an electrode actuator scheme is provided in accordance with either FIGS. 10A through 10C or FIGS. 11A through 11C, both sets of figures being cross sectional views taken at 10—10 of FIG. 9. The processes illustrated in FIGS. 10A through 10C and FIGS. 11A through 11C differ in how the metal electrodes used in actuating the torsional resonator 200 are defined. In both cases, the electrodes are fabricated by an isotropic dry etch and the released structure is formed by an undercut-etch of the silicon beams. The grid 200 serves to increase the mass of the resonator, as discussed above, with respect to FIG. 7. When suitable potentials are applied across these electrodes, the resonator 200 rotates about the common axis of beams 208 and 210, as indicated by the arrows 220. The torsion beams 208 and 210 may be about 0.8 $\mu$m wide and 2 $\mu$m high, for example.

Figures 10A, 11A:
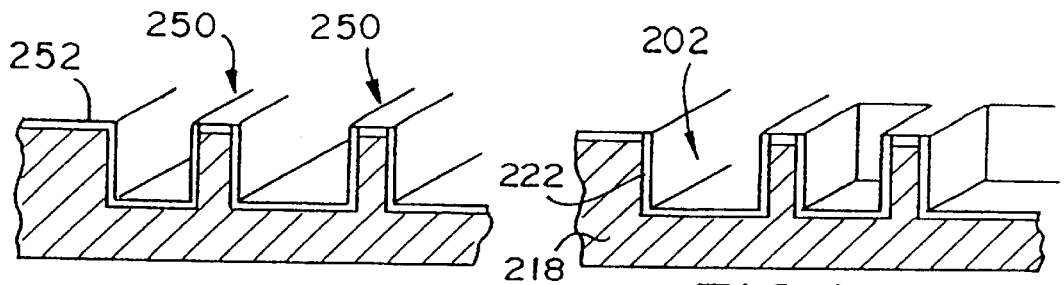
FIGS. 10A–10C illustrate steps for producing electrodes for use in the structure of FIG. 9.
FIGS. 11A–11C illustrate steps for producing a modified form of electrodes for use in the structure of FIG. 9.
Figures 10B, 11B:
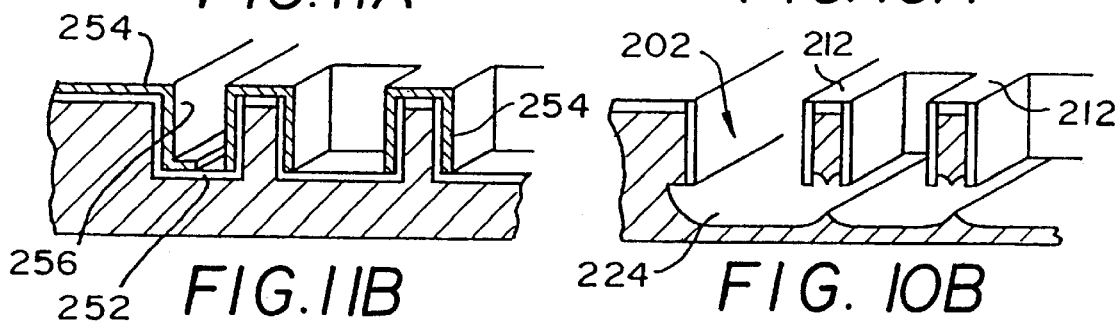
Figures 10C, 11C:
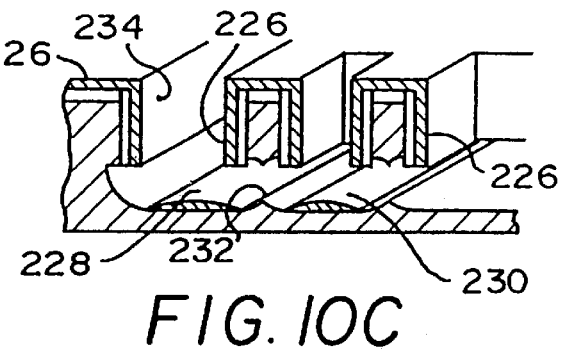

In accordance with the process of FIGS. 10A through 10C, the trench 202 is etched in the substrate 218 with the surfaces covered by a mask oxide 222, in the manner illustrated in FIG. 1F. The bottom of the trench 202 is etched in the manner in FIGS. 1G and 1H, and the beams 212 and released in the manner described with respect to FIG. 1I, leaving the beams spaced above the floor 224 of the trench. Thereafter, as illustrated in FIG. 10C, metal 226 is evaporated through the released structure to coat the top surface and side walls of the surrounding mesa and the beams 212, as previously discussed, and also providing metal on the bottom wall 224, as illustrated at 228 and 230 in FIG. 10C. Shadowing of the evaporated metal by the grid structure 200, and more particularly by beams 212 in FIG. 10C, produces a break 232 in the metal on floor 224 of the trench so that the metal area 228 lying between the grid 200 and side wall 234 of trench 202 (FIG. 9) is electrically isolated from the remaining metal on the floor of the trench. By extending the trench past the end wall 206 as indicated at 236 to a contact pad diagrammatically illustrated at 238, electrical connections can be made to the metal 228 to form an electrode. Similarly, the metal 226 on the grid 200 can also be electrically connected to a suitable pad, in the manner illustrated in FIG. 2, so that a potential can be applied between the metal on the grid 200 and the metal layer 228 on the floor of the trench.

A similar electrode structure is provided on the opposite side of grid 200, adjacent the side wall 240 (FIG. 9) with the electrode formed on the floor of the trench adjacent wall 240 extending to a contact pad 242 for connection to suitable circuitry. Potentials provided between the grid 200 and either of the electrode adjacent wall 234 or the electrode adjacent wall 240 apply torsional forces to the grid 200, causing it to pivot about its mounting beams 208, 210, so that the grid twists in the direction of arrows 220, raising one lateral edge or the other out of the plane of substrate 218.

FIGS. 11A through 11C provide an alternative electrode arrangement, but in this case a second masking step is required. As illustrated in FIG. 11A, the wafer is patterned to form islands 250 covered by an oxide layer 252 in the manner illustrated in FIG. 1F. A metal layer 254 is then applied to the entire top surface of the wafer and the metal is patterned to remove it from the floor of the trenches between the islands 250 and to partially remove the metal from the floor of the trench extending between the islands and the substrate side wall 256. Thereafter, the oxide layer 252 is removed from the floors of the trenches in the manner illustrated in FIG. 1G, and the silicon is etched in the manner described with respect to FIG. 11 to release the grid 200, and its corresponding beams 212 (FIG. 11C). This process leaves a side wall electrode on wall 256 with a horizontal lip 258 which extends toward the grid 200 and functions generally in the manner of the bottom electrode 228 described with respect to FIG. 10C.

In both of the structures of FIGS. 10C and 11C, the metal quoting on the grid is capacitively coupled with the corresponding electrode 228 or 258, respectively, to provide the necessary torsional force on grid 200. No additional external electrodes above the surface of the wafer are required to produce rotational motion out of the plane of the substrate. If desired, the grid 200 dam be covered tungsten in the manner described with respect to FIGS. 8A through 8L to increase its mass. Furthermore, the tungsten can be mechanically polished to a flat surface so that the metal layer can act as a mirror, whereby rotation of the grid about the axes 208, 210 can provide accurate directional control of a reflected beam of light. Such a structure is illustrated in FIG. 12 wherein a tungsten layer 260 is shown as having a flat, polished top surface 262.

It is noted that the capacitive effect between the stationary electrodes on the substrate and the movable electrodes on the grid in the devices of FIG. 10C and 11C are dependent upon the spacing between the grids as well as upon the potential applied between the electrodes. In accordance with the process of the present invention, this spacing can be in the range of 5 μm so that this capacitance is more significant than any capacitance that exists between the grid and the ground plane of the substrate beneath the grid, thereby allowing the potential across the capacitive plates to control the motion of the grid.

Figure 9:
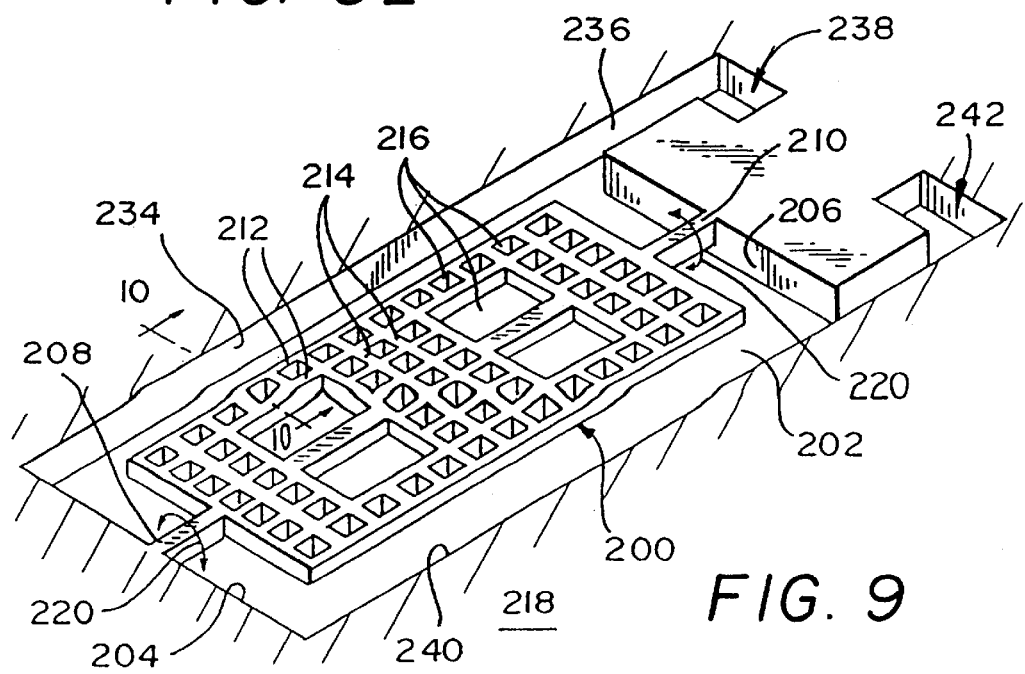
FIG. 9 is a diagrammatic perspective view of a structure for providing torsional motion.
Figure 12:
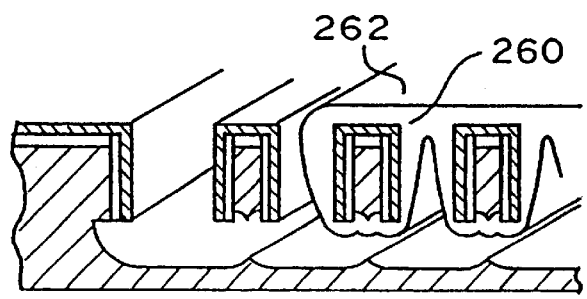
FIG. 12 is a partial cross-sectional view of FIG. 9 illustrating a modification of the torsional structure.

Although tungsten is preferred as the coating for the grid, as illustrated in FIGS. 8L and 12, it will be understood that a dielectric such as nitride or oxide can be used as a membrane on a grid structure such as that illustrated in FIG. 7, or even on the structure of FIG. 9, for use in pressure sensing or like applications.

Figure 13:
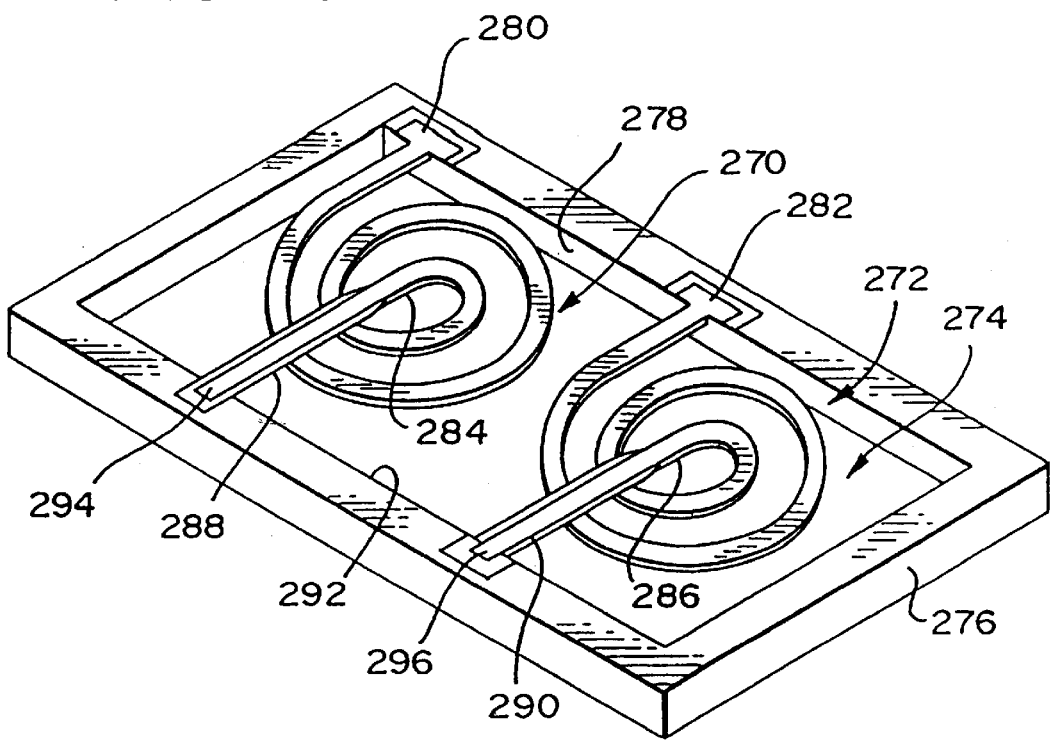
FIG. 13 illustrates a structure fabricated in accordance with the process of the invention.

Although the foregoing illustrations have all been directed to essentially rectangular beam structures, it will be understood that the photolithographic process described above can be used to fabricate any desired shape. Examples of such shapes are illustrated in FIG. 13, wherein a pair of spiral beams 270 and 272 are fabricated in a trench 274 formed in a substrate, or wafer 276. The spiral shape of the beam structures is produced in the photolithographic step, and the resulting beam is coated by a dielectric and by a metal layer in the manner illustrated in FIGS. 1A through 1J. One end of the spiral is connected to a side wall 278 of the cavity 274 and the metal is connected to a contact pad diagrammatically illustrated at 280 on the substrate 276. In similar manner, one end of the second spiral 272 is connected to wall 78, for example, with its metal layer connected to a contact pad 282.

To connect the opposite end of the spiral to an electrode so that each spiral can form an inductor, the free end 284 and 286 of spirals 270 and 272, respectively, are connected by way of dielectric bridges 288 and 290, respectively, to the opposite side wall 292, for example, of trench 274. This dielectric bridge extends across the intervening spiral portions of the respective beams to provide supports and electrical isolation for subsequent deposition of electrodes 294 and 26, respectively, which extends to pads at the edge of the wafer for electrical connection to the spiral beams. In this way, microelectromechanical inductors can be fabricated in accordance with the invention, with the adjacent inductors 270 and 272 forming a microtransformer, if desired. If desired, metal electrodes can be deposited on the floor of the trench 274 beneath one or both of the spiral beams so that a potential can be applied between the electrodes on the beams and on the floor to provide capacitive control of vertical motion of the beam. Such a variation in the position of one spiral with respect to the other changes the inductive relationship between the two to thereby provide a variable transformer. Similarly, electrodes on the side walls of the trench 274, such as side wall 278, permit a capacitive connection with electrodes on the side walls of the spirals 270 and 272 to permit lateral motion of the spirals to thereby change the spacing between adjacent coils and change the inductance of the beams.

In summary, the present invention is directed to a silicon process for fabricating single crystal silicon MEM devices utilizing a single mask to define all components. The process is low temperature, self-aligned, and independent of crystal orientation, and relies on industry standard fabrication processes and tools. The process can be used to produce discrete devices on wafers, or can be used in combination with VLSI integrated circuit processes without major modification of the IC processes because of its low temperature requirements, simple design rules, and short process times. The low temperatures used in the present process do not adversely affect existing IC circuits, so MEM devices can be fabricated on completed IC wafers. The device as an important application has an accelerometer, allowing such devices to be incorporated in integrated circuits, for example, or fabricated on discrete wafers for use in a wide range of applications, with a tungsten process being provided to increase the mask of the MEM device for such applications.

Although the invention has been described in terms of preferred embodiments, it will be apparent to those of skill in the art that numerous variations and modifications may be made without departing from the true spirit and scope thereof, as set forth in the following claims:

What is claimed is:

1. A microelectromechanical structure fabricated in a single crystal substrate independently of crystal orientation by a low temperature, single mask process, comprising:

a single crystal wafer having a top surface;

trench means in the surface of said wafer defining a released beam and a support for said beam spaced from a surrounding substrate, said beam being movable with respect to said substrate;

an electrically insulating layer on said released beam, said support, and said substrate; and an electrically conductive coating on said insulating layer on said released beam, support and substrate, said trench means electrically isolating the conductive coating on said beam from the conductive coating on said substrate.

2. The device of claim 1, further including means for producing a potential difference between said beam coating and said substrate coating for producing motion of said beam in the plane of said top surface.

3. The device of claim 1, wherein said support for said beam includes contact pad means and interconnect means including said electrically insulating layer and said conductive coating extending between said beam and said contact pad means, said contact pad and interconnect means being defined by said trench means.

4. The device of claim 3, wherein the electrically conductive coating on said interconnect means and on said contact pad means is electrically isolated from said substrate conductive coating by said trench means.

5. The device of claim 3, further including electrode means and corresponding electrode contact pad and electrode interconnect means in the top surface of said wafer, said electrode means having an electrically conductive coating and being spaced from and electrically isolated from said beam means by said trench means to provide capacitive coupling between said released beam and said electrode means.

6. The device of claim 3, wherein said released beam comprises an elongated, cantilevered arm connected at one end to said support.

7. The device of claim 6, wherein said released beam further comprises enlarged grid means carried by said arm.

8. The device of claim 7, further including means carried by said grid for increasing the mass thereof.

9. The device of claim 7, further including a membrane carried by said grid.

10. The device of claim 7, further including electrode means in said trench adjacent at least one edge of said grid and positioned to provide capacitive coupling between said grid and said electrode means to produce torsional motion of said grid about said cantilevered arm.

11. A micromechanical device, comprising:
a substrate having a top surface;
a trench extending into said substrate through said surface to form spaced walls and a floor in said substrate, said trench walls each having an undercut portion adjacent said floor;
a layer of conductive material on the surface of said substrate, on said walls, and on said floor, said undercut portions electrically isolating the layer of conductive material on said walls of said trench from the layer of conductive material on the floor of said trench.

12. The device claim 11, wherein said trench walls define a structure within a cavity in said substrate, a first of said spaced walls being located on said substrate and a second of said spaced walls being located on said structure, said trench floor extending between said walls and forming a floor for said cavity.

13. The device of claim 12, wherein at least a portion of said structure is released from said substrate and is movable with respect to said substrate.

14. The device of claim 13, wherein at least a portion of said structure is fixed to said substrate, said movable portion of said structure having a first end mounted on said fixed portion of said structure and a second end spaced from and movable with respect to said substrate.

15. The device of claim 12, wherein said structure includes a top surface, and further including a conductive material on at least a portion of said top surface and electrically connected to conductive material on said second spaced wall.

16. The device of claim 15, wherein conductive material on said surface of said substrate is electrically connected to conductive material on said first spaced wall, said undercut portions electrically isolating said conductive material on said first spaced wall from said conductive material on said second spaced wall.

17. The device of claim 15, wherein said first and second trench walls are substantially perpendicular to said substrate surface, said second wall forming sides of said structure.

18. The device of claim 17, wherein said trench surrounds said structure, said second wall being continuous and surrounding said structure to form an island spaced on all sides from said substrate.

19. The device of claim 17, wherein said trench extends substantially completely around said structure, said second wall being continuous to form a peninsula within said cavity.

20. The device of claim 17, wherein said undercut portions of said spaced walls extend laterally from trench sufficiently far to produce a discontinuity in said conductive material on said walls.

21. A microstructure, comprising:
a single crystal silicon substrate having a top surface and a trench extending into the substrate through said surface to form in the substrate at least a first vertical wall having a top edge at said surface and a base portion intersecting a horizontal floor;
an undercut cavity portion extending into said substrate along the intersection of said base portion and said floor to undercut the vertical wall;
an electrically insulating layer on said top surface and said vertical wall, and a metal layer on the insulating layers on said top surface, said vertical wall, and said horizontal floor, the metal layer on said vertical wall being electrically isolated from the metal layer on said floor by said undercut cavity portion.

22. The microstructure of claim 21, further including a second vertical wall spaced from said first wall and having a base portion intersecting said floor and a cavity portion extending into said substrate along the intersection of said base portion and said floor to undercut said second wall.

23. The microstructure of claim 22, further including an insulating layer on said second wall and a metal layer on the insulating layer, said undercut cavity in said second wall electrically isolating said second wall metal layer from the metal layers on said floor and on said first wall.

* * * * *